(12) United States Patent
Lee et al.

(10) Patent No.: US 11,783,778 B2
(45) Date of Patent: Oct. 10, 2023

(54) DISPLAY DEVICE

(71) Applicant: SAMSUNG DISPLAY CO., LTD., Yongin-si (KR)

(72) Inventors: Seung Chan Lee, Hwaseong-si (KR); Dong Hyun Kim, Seoul (KR); Hyeong Seok Kim, Hwaseong-si (KR); Young Wan Seo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/567,436

(22) Filed: Jan. 3, 2022

(65) Prior Publication Data

US 2022/0165215 A1    May 26, 2022

Related U.S. Application Data

(63) Continuation of application No. 16/998,504, filed on Aug. 20, 2020, now Pat. No. 11,217,176.

(30) Foreign Application Priority Data

Aug. 22, 2019   (KR) ........................ 10-2019-0102989

(51) Int. Cl.
| | |
|---|---|
| *G09G 3/3258* | (2016.01) |
| *H10K 59/131* | (2023.01) |
| *G09G 3/3266* | (2016.01) |
| *G06V 40/19* | (2022.01) |
| *H04N 23/57* | (2023.01) |

(52) U.S. Cl.
CPC ........... *G09G 3/3258* (2013.01); *G06V 40/19* (2022.01); *G09G 3/3266* (2013.01); *G09G 2320/0233* (2013.01); *G09G 2330/02* (2013.01); *G09G 2360/145* (2013.01); *H04N 23/57* (2023.01); *H10K 59/131* (2023.02)

(58) Field of Classification Search
CPC ............... G09G 3/3258; G09G 3/3266; G09G 2330/021; G09G 2330/028; G09G 2320/0686; G09G 2320/0233; H01L 27/3276

See application file for complete search history.

(56) References Cited

U.S. PATENT DOCUMENTS

| | | | |
|---|---|---|---|
| 10,847,097 B2 | 11/2020 | Park | |
| 11,263,968 B2 * | 3/2022 | Wang | .................. H01L 27/3234 |
| 2015/0364076 A1 | 12/2015 | Park et al. | |
| 2017/0061858 A1 | 3/2017 | Kim et al. | |
| 2018/0166017 A1 | 6/2018 | Li et al. | |

(Continued)

FOREIGN PATENT DOCUMENTS

| | | |
|---|---|---|
| JP | 2010-230797 | 10/2010 |
| KR | 10-2017-0122432 | 11/2017 |

*Primary Examiner* — Sardis F Azongha

(74) *Attorney, Agent, or Firm* — F. Chau & Associates, LLC

(57) ABSTRACT

A display device includes: a display panel including a first area and a second area, wherein the first area includes first sub-pixels, and the second area includes second sub-pixels; and a power supply unit that generates a first driving voltage and a second driving voltage greater than the first driving voltage to supply the first and second driving voltages to the display panel. The first sub-pixels receive the first driving voltage, and the second sub-pixels receive the first driving voltage or the second driving voltage.

22 Claims, 19 Drawing Sheets

(56) References Cited

U.S. PATENT DOCUMENTS

| | | |
|---|---|---|
| 2018/0366586 A1 | 12/2018 | Son et al. |
| 2019/0013368 A1 | 1/2019 | Chung et al. |
| 2020/0152134 A1 | 5/2020 | Lee et al. |
| 2021/0056906 A1 | 2/2021 | Lee et al. |

* cited by examiner

DISPLAY DEVICE

CROSS-REFERENCE TO RELATED APPLICATIONS

This application is a continuation of U.S. patent application Ser. No. 16/998,504 filed on Aug. 20, 2020, which claims priority under 35 U.S.C. § 119 to from Korean Patent Application No. 10-2019-0102989, filed on Aug. 22, 2019, in the Korean Intellectual Property Office, the disclosures of which are incorporated by reference herein in their entireties.

TECHNICAL FIELD

The present invention relates to a display device, and more particularly, to a display device including a power supply unit providing a driving voltage to a display panel of the display device.

DISCUSSION OF THE RELATED ART

With the development of information society, applications of display devices for displaying images have increased. For example, display devices are applied to various electronic appliances such as smart phones, digital cameras, notebook computers, navigators, and smart televisions. A typical display device may include a display panel including a plurality of pixels connected to scan lines, data lines, and power supply lines to display an image. Further, a display device may include various sensor devices such as a proximity sensor for detecting whether a user is located adjacent to the front surface of the display device. In addition, a display device may include an illumination sensor for detecting the luminance of incident light on the front surface of the display device, and an iris sensor for recognizing a user's iris. These sensor devices may be respectively disposed in holes disposed on the front surface of the display device not overlapping a display panel.

As display devices are applied to various electronic appliances, display devices may have various forms and designs. For example, a smart phone may widen a display area by removing holes disposed on the front surface of the display device. Although the sensor devices disposed on the front surface of the display device may be disposed to overlap the display panel, the number of pixels may be reduced by the area where the sensor devices are disposed.

SUMMARY

According to an exemplary embodiment of the present invention, a display device includes: a display panel including a first area and a second area, wherein the first area includes first sub-pixels, and the second area includes second sub-pixels; and a power supply unit that generates a first driving voltage and a second driving voltage greater than the first driving voltage to supply the first and second driving voltages to the display panel. The first sub-pixels receive the first driving voltage, and the second sub-pixels receive the first driving voltage or the second driving voltage.

In an exemplary embodiment of the present invention, the power supply unit includes: a first driving voltage generator that generates the first driving voltage; and a second driving voltage generator that generates the second driving voltage.

In an exemplary embodiment of the present invention, the power supply unit further includes: a first switching element selectively connecting the first driving voltage generator to the second sub-pixels; and a second switching element selectively connecting the second driving voltage generator to the second sub-pixels.

In an exemplary embodiment of the present invention, the display device further includes a mode selector that supplies first and second mode signals to the power supply unit, wherein the first switching element receives the first mode signal from the mode selector to be turned on, and the second switching element receives the second mode signal from the mode selector to be turned on.

In an exemplary embodiment of the present invention, the display device further includes a display driving circuit that drives the display panel, wherein the display driving circuit includes: a first switching element selectively connecting the first driving voltage generator to the second sub-pixels; and a second switching element selectively connecting the second driving voltage generator to the second sub-pixels.

In an exemplary embodiment of the present invention, the display device further includes a mode selector that supplies first and second mode signals to the display driving circuit, wherein the first switching element receives the first mode signal from the mode selector to be turned on, and the second switching element receives the second mode signal from the mode selector to be turned on.

In an exemplary embodiment of the present invention, the display device further includes a first switching unit mounted on a circuit board, wherein the power supply unit is mounted on the circuit board, wherein the first switching unit includes: a first switching element selectively connecting the first driving voltage generator to the second sub-pixels; and a second switching element selectively connecting the second driving voltage generator to the second sub-pixels.

In an exemplary embodiment of the present invention, the display device further includes a mode selector that supplies first and second mode signals to the first switching unit, wherein the first switching element receives the first mode signal from the mode selector to be turned on, and the second switching element receives the second mode signal from the mode selector to be turned on.

In an exemplary embodiment of the present invention, the display device further includes a second switching unit disposed on a substrate of the display panel, wherein the second switching unit includes: a first switching element selectively connecting the first driving voltage generator to the second sub-pixels; and a second switching element selectively connecting the second driving voltage generator to the second sub-pixels.

In an exemplary embodiment of the present invention, the display device further includes a mode selector supplying first and second mode signals to the second switching unit, wherein the first switching element receives the first mode signal from the mode selector to be turned on, and the second switching element receives the second mode signal from the mode selector to be turned on.

In an exemplary embodiment of the present invention, the display panel includes: a first horizontal voltage supply line disposed at one side of the first area; a first vertical voltage supply line connected to the first horizontal voltage supply line, wherein the first vertical voltage supply line supplies the first driving voltage to the first sub-pixels; a second horizontal voltage supply line disposed at one side of the second area; and a second vertical voltage supply line connected to the second horizontal voltage supply line, wherein the second vertical voltage supply line supplies the first driving voltage or the second driving voltage to the second sub-pixels.

In an exemplary embodiment of the present invention, the display panel further includes: a first switching element disposed between the first vertical voltage supply line and the second vertical voltage supply line; and a second switching element selectively supplying the second driving voltage to the second horizontal voltage supply line.

In an exemplary embodiment of the present invention, the display device further includes a mode selector that supplies first and second mode signals to the first and second switching elements, wherein the first switching element receives the first mode signal from the mode selector to be turned on, and the second switching element receives the second mode signal from the mode selector to be turned on.

In an exemplary embodiment of the present invention, a number of the first sub-pixels per unit area of the first area is larger than a number of the second sub-pixels per unit area of the second area.

According to an exemplary embodiment of the present invention, a display device including: a display panel including a first area and a second area, wherein the first area includes first sub-pixels, and the second area includes second sub-pixels, wherein the display panel includes: a first horizontal voltage supply line disposed at one side of the first area; a first vertical voltage supply line connected to the first horizontal voltage supply line, wherein the first vertical voltage supply line supplies a first driving voltage to the first sub-pixels; a second horizontal voltage supply line disposed at one side of the second area; and a second vertical voltage supply line connected to the second horizontal voltage supply line, wherein the second vertical voltage supply line supplies the first driving voltage or a second driving voltage greater than the first driving voltage to the second sub-pixels.

In an exemplary embodiment of the present invention, wherein the first horizontal voltage supply line and the second horizontal voltage supply line are disposed on a first layer disposed on a substrate of the display panel, and the first vertical voltage supply line and the second vertical voltage supply line are disposed on a second layer disposed on the first layer.

In an exemplary embodiment of the present invention, each of the first sub-pixels and the second sub-pixels further includes a thin film transistor including an active layer, a gate electrode, a source electrode, and a drain electrode, and wherein the first horizontal voltage supply line and the second horizontal voltage supply line are disposed on the same layer as the gate electrode, and the first vertical voltage supply line and the second vertical voltage supply line are disposed on the same layer as the source electrode and the drain electrode.

In an exemplary embodiment of the present invention, the display device further including a power supply unit including a first driving voltage generator that generates the first driving voltage and a second driving voltage generator that generates the second driving voltage.

In an exemplary embodiment of the present invention, the power supply unit further includes: a first switching element selectively connecting the first driving voltage generator to the second sub-pixels; and a second switching element selectively connecting the second driving voltage generator to the second sub-pixels.

In an exemplary embodiment of the present invention, the display device further includes a display driving circuit that drives the display panel, wherein the display driving circuit further includes: a first switching element selectively connecting the first driving voltage generator to the second sub-pixels; and a second switching element selectively connecting the second driving voltage generator to the second sub-pixels.

In an exemplary embodiment of the present invention, the display device further includes a first switching unit mounted on a circuit board, wherein the power supply unit is mounted on the circuit board, wherein the first switching unit includes: a first switching element selectively connecting the first driving voltage generator to the second sub-pixels; and a second switching element selectively connecting the second driving voltage generator to the second sub-pixels.

In an exemplary embodiment of the present invention, the display device further includes a second switching unit disposed on a substrate of the display panel, wherein the second switching unit includes: a first switching element selectively connecting the first driving voltage generator to the second sub-pixels; and a second switching element selectively connecting the second driving voltage generator to the second sub-pixels.

In an exemplary embodiment of the present invention, the display panel includes: a first switching element disposed between the first vertical voltage supply line and the second vertical voltage supply line; and a second switching element selectively connecting the second driving voltage generator to the second horizontal voltage supply line.

According to an exemplary embodiment of the present invention, a display device, including: a display panel including a first area and a second area, wherein the first area includes first sub-pixels and a first voltage supply line connected to the first sub-pixels, wherein the second area includes second sub-pixels, a second voltage supply line connected to the second sub-pixels, and a plurality of sensors; a first driving voltage generator connected to the first sub-pixels and that generates a first driving voltage; a second driving voltage generator that generates a second driving voltage; a first switching element selectively connecting the first driving voltage generator to the second voltage supply line and the second sub-pixels; and a second switching element selectively connecting the second driving voltage generator to the second voltage supply line and the second sub-pixels.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
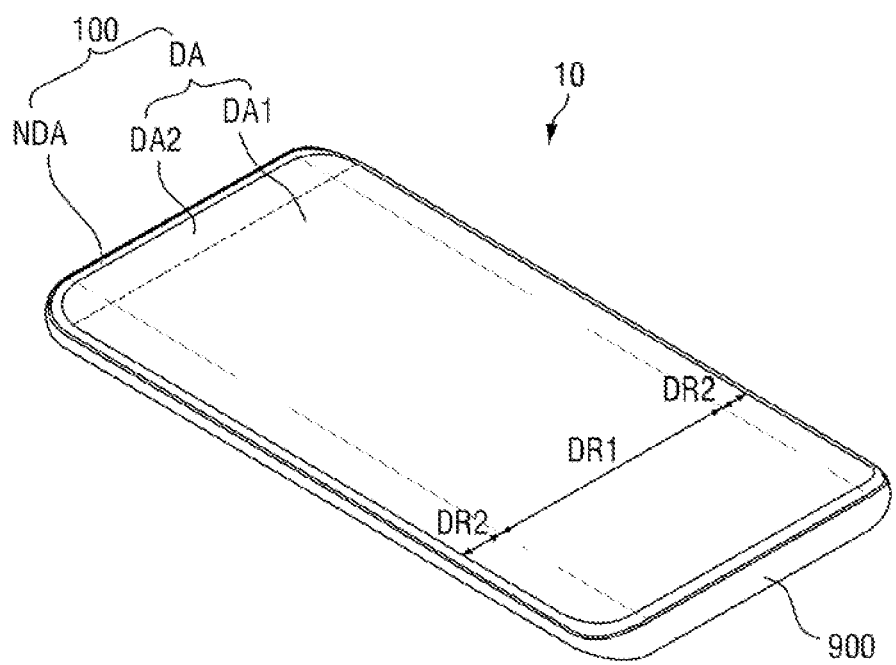
FIG. 1 is a perspective view of a display device according to an exemplary embodiment of the present invention.

As used herein "embodiments" and "implementations" are interchangeable words that are non-limiting examples of the present invention disclosed herein. It is apparent, however, that various exemplary embodiments of the present invention may be practiced with one or more equivalent arrangements. It is to be understood that the present invention may, however, be embodied in different forms and thus should not be construed as being limited to the exemplary embodiments set forth herein. For example, shapes, configurations, and characteristics of an exemplary embodiment of the present invention may be used or implemented in another exemplary embodiment of the present invention without departing from the spirit and scope of the present invention.

It is to be understood, unless otherwise specified, that the features, components, modules, layers, films, panels, regions, and/or aspects, etc. (hereinafter individually or collectively referred to as "elements") of various exemplary embodiments of the present invention may be otherwise combined, separated, interchanged, and/or rearranged without departing from the spirit and scope of the present invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment of the present invention may be implemented differently, a specific process order may be performed differently from the described order. For example, two consecutively described processes may be performed substantially at the same time or performed in an order opposite to the described order. Also, like reference numerals may denote like elements, and thus repetitive descriptions may be omitted.

When an element, such as a layer, is referred to as being "on," "connected to," or "coupled to" another element or layer, the element or layer may be directly on, connected to, or coupled to the other element or layer or intervening elements or layers may be present therebetween. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the spirit and scope of the present invention.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, in the example, the term "below" or "beneath" can encompass both an orientation of above and below. Furthermore, the apparatus may be otherwise oriented (e.g., rotated 90 degrees or at other orientations), and, as such, the spatially relative descriptors used herein interpreted accordingly.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Some exemplary embodiments of the present invention may be described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also understood that each block, unit, and/or module may be implemented by dedicated hardware, or as a combination of dedicated hardware to perform some functions and a processor (e.g., one or more programmed microprocessors and associated circuitry) to perform other functions. In addition, each block, unit, and/or module of an exemplary embodiment of the present invention may be physically separated into two or more interacting and discrete blocks, units, and/or modules without departing from the spirit and scope of the present invention. Further, the blocks, units, and/or modules of an exemplary embodiment of the present invention may be physically combined into more complex blocks, units, and/or modules without departing from the spirit and scope of the present invention.

Figure 2:
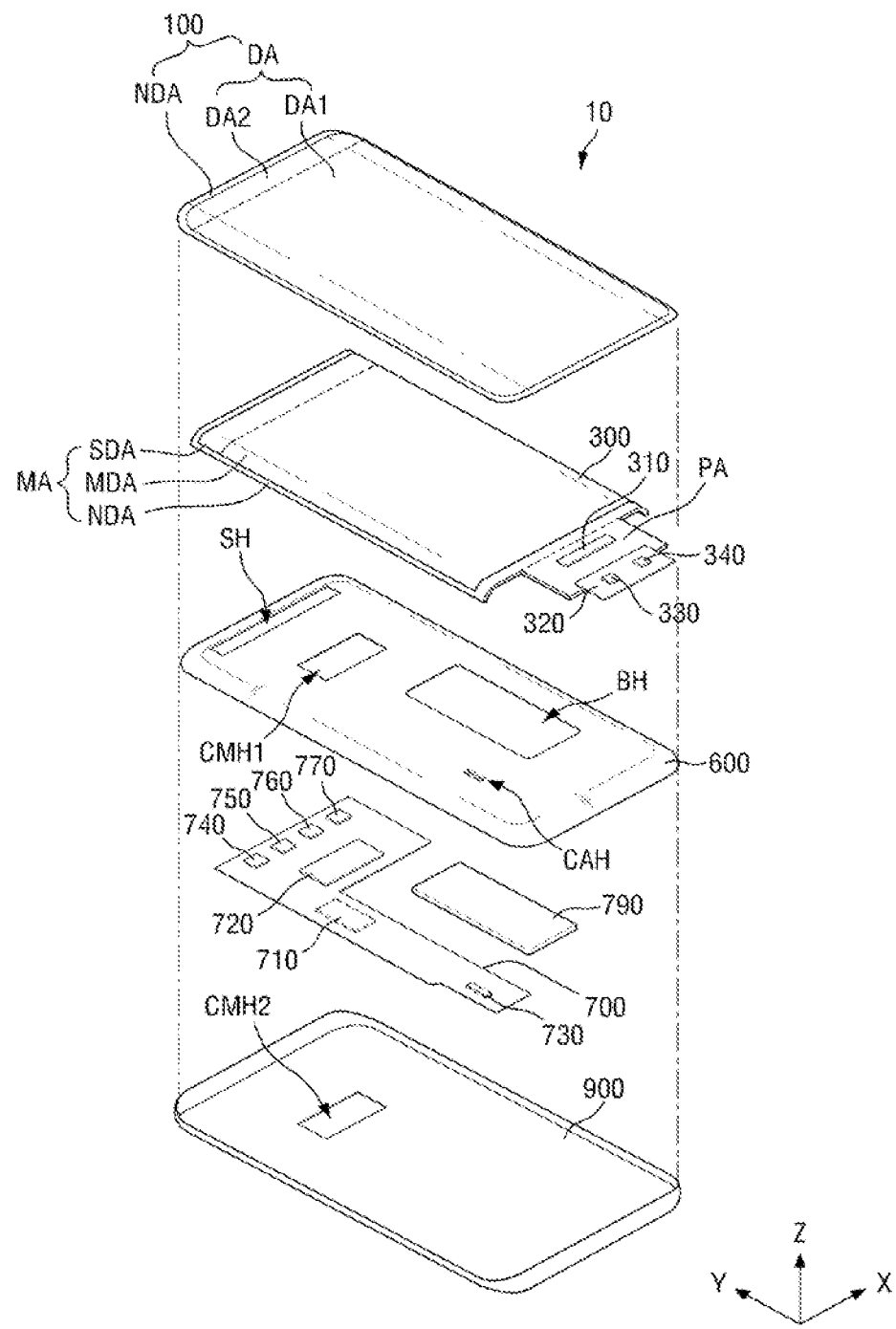
FIG. 2 is an exploded perspective view of a display device according to an exemplary embodiment of the present invention.

FIG. 1 is a perspective view of a display device according to an exemplary embodiment of the present invention, and FIG. 2 is an exploded perspective view of a display device according to an exemplary embodiment of the present invention.

Referring to FIGS. 1 and 2, a display device 10 according to an exemplary embodiment of the present invention includes a cover window 100, a display panel 300, a bracket 600, a main circuit board 700, and a lower cover 900.

The display device 10, which is a device for displaying a moving image or a still image, may be used as a display screen of various products such as televisions, notebooks, monitors, billboards, and internet of things, as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs.

The display device 10 may have a rectangular shape in a plan view. For example, as shown in FIGS. 1 and 2, the display device 10 may have a rectangular planar shape having short sides in the first direction (X-axis direction) and long sides in the second direction (Y-axis direction). The corner where the short side in the first direction (X-axis direction) meets the long side in the second direction (Y-axis direction) may be formed to have a round shape of a predetermined curvature or have a right angle shape. The planar shape of the display device 10 is not limited to a rectangular shape, and may be formed in another polygonal shape, circular shape, or elliptical shape.

The display device 10 may include a first region DR1 formed flat and a second region DR2 extending from the right and left sides of the first region DR1. The second region DR2 may be formed to be flat or curved with respect to the first region DR1. When the second region DR2 is formed to be flat, the angle formed by the first region DR1 and the second region DR2 may be an obtuse angle. When the second region DR2 is formed to be curved, the second region DR2 may have a constant curvature or a variable curvature.

Although it is shown in FIG. 1 that the second region DR2 extends from the left and right sides of the first region DR1, the present invention is not limited thereto. For example, the second region DR2 may extend from the left side or the right side of the first region DR1. In addition, the second region DR2 may extend from the upper side or the lower side of the first region DR1 in addition to extending from the left side or right side of the first region DR1. Hereinafter, it may be assumed that the second region DR2 is disposed along the left and right edges of the display device 10.

The cover window 100 may be disposed on the display panel 300 to cover the upper surface of the display panel 300. The cover window 100 may protect the upper surface of the display panel 300.

The cover window 100 may be disposed in the first region DR1 and the second region DR2. The cover window 100 may include a display area DA and a light blocking area NDA at least partially surrounding the display area DA. Further, the display area DA may include a first light transmitting portion DA1 and a second light transmitting portion DA2. The first light transmitting portion DA1 and the second light transmitting portion DA2 may correspond to the display panel 300. The light blocking area NDA may correspond to an area other than the display panel 300. The second light transmitting portion DA2 may be disposed at one side of the first light transmitting portion DA1, for example, the upper side thereof as shown in FIGS. 1 and 2. The first light transmitting portion DA1 and the second light transmitting portion DA2 may be disposed in the first region DR1 and the second region DR2. The light blocking area NDA100 may be formed to be opaque. In addition, the light blocking area NDA100 may be formed as a decorative layer having a pattern that can be seen to a user when an image is not displayed.

The display panel 300 may be disposed under the cover window 100. The display panel 300 may be disposed in the first region DR1 and the second regions DR2. Thus, the image of the display panel 300 may be seen not only in the first region DR1 but also in the second regions DR2 through the cover window 100. For example, the image of the display panel 300 may be seen from the upper surface and left and right edges of the display device 100 through the cover window 100.

The display panel 300 may be a light emitting display panel including a light emitting element. Examples of the display panel 300 may include an organic light emitting display panel using an organic light emitting diode including an organic light emitting layer, an ultra-micro light emitting diode display panel using an ultra-micro light emitting diode (ultra-micro LED, a quantum dot light emitting diode display panel using a quantum dot light emitting diode including a quantum dot light emitting layer, and an inorganic light emitting display panel using an inorganic light emitting diode including an inorganic semiconductor. Hereinafter, the display panel 300 is an organic light emitting display panel as an example, but the present invention is not limited thereto.

The display panel 300 may include a main area MA and a protrusion area PA protruding from one side of the main area MA.

The main area MA may include a general area MDA, a sensor area SDA, and a non-display area NDA.

The display panel 300 may include a general area MDA and a sensor area SDA. The general area MDA may be disposed to overlap the first light transmitting portion DA1 of the cover window 100. The sensor area SDA may be disposed to overlap the second light transmitting portion DA2 of the cover window 100. The sensor area SDA may be disposed at one side of the general area MDA, for example, the upper side thereof as shown in FIG. 2, but the present invention is not limited thereto. As another example, the sensor area SDA may be disposed to be surrounded by the general area MDA, and may be disposed adjacent to the corners of the display panel 300. Although it is shown in FIG. 2 that the display panel 300 includes one sensor area SDA, the present invention is not limited thereto. For example, the display panel 300 may include a plurality of sensor areas SDA.

Each of the general area MDA and the sensor area SDA may include a plurality of pixels, scan lines and data lines connected to the plurality of pixels, and a power supply line.

The non-display area NDA may be an edge area of the display panel 300. The non-display area NDA may include a scan driver for applying scan signals to the scan lines, and link lines connecting the data lines to a display driving circuit 310.

Figure 3:
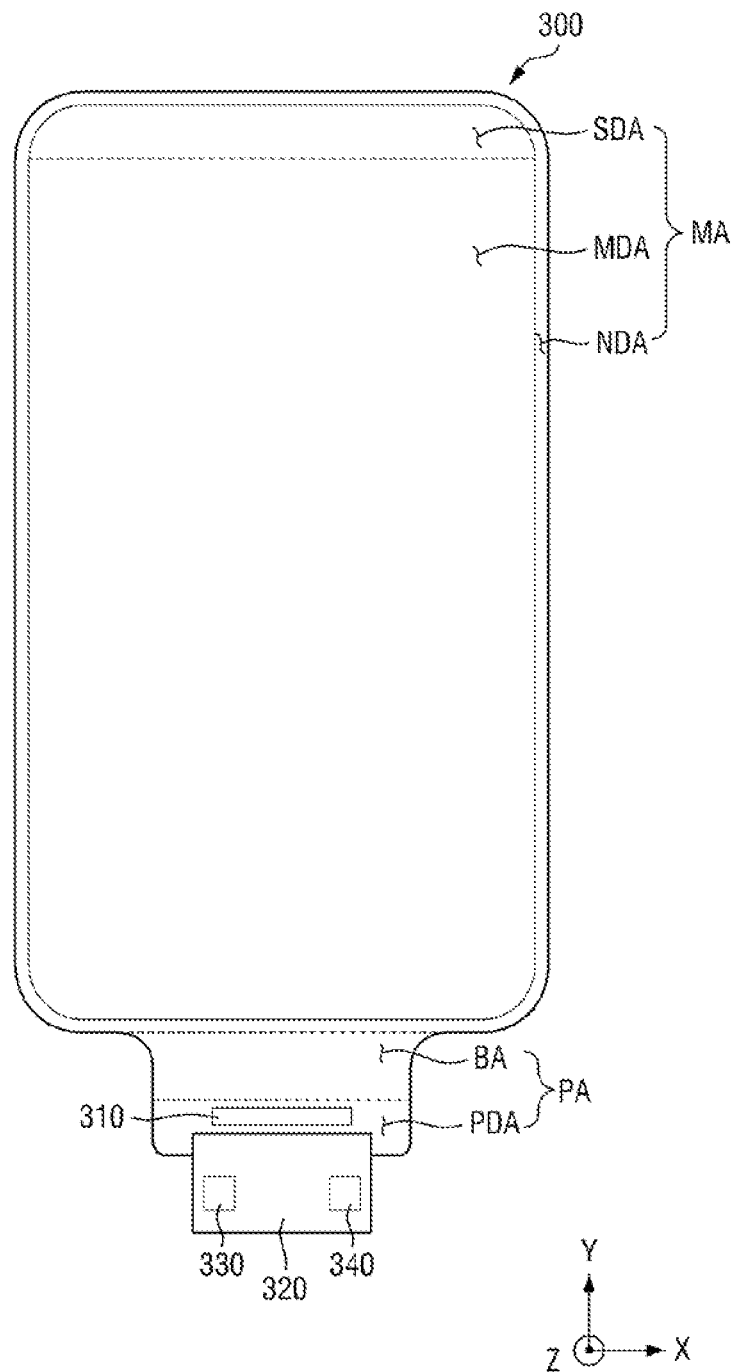
FIG. 3 is a plan view of a display device according to an exemplary embodiment of the present invention.

The protrusion area PA may protrude from one side of the main area MA. As shown in FIG. 3, the protrusion area PA may protrude from the lower side of the general area MDA. For example, the protrusion area PA and the sensor area SDA may be at different sides of the general area MDA from each other, but the present invention is not limited thereto. As an additional example, the length of the protrusion area PA in the first direction (X-axis direction) may be smaller than the length of the main area MA in the first direction (X-axis direction).

The protrusion area PA may include a bending area BA and a pad area PDA. In this case, the pad area PDA may be disposed at one side of the bending area BA, and the main area MA may be disposed at the other side of the bending area BA. For example, the pad area PDA may be disposed at the lower side of the bending area BA, and the main area MA may be disposed at the upper side of the bending area BA.

The display panel 300 may be formed to be curved, warped, bent, folded, or rolled. For example, the display panel 300 may be flexible. Therefore, the display panel 300 may be bent in the thickness direction (Z-axis direction) in the bending area BA.

The display panel 300 may include a display driving circuit 310, a circuit board 320, a power supply unit 330, and a touch driving circuit 340.

The display driving circuit 310 may output signals and voltages for driving the display panel 300. For example, the display driving circuit 310 may supply a data voltage to a data line. In addition, the display driving circuit 310 may supply a power supply voltage to a power supply line, and may supply a scan control signal to a scan driver.

The circuit board 320 may be attached onto the pads of the pad area PDA using an anisotropic conductive film (ACF). The lead lines of the circuit board 320 may be electrically connected to the pads of the display panel 300. For example, the circuit board 320 may be a flexible printed circuit board (FPCB), a printed circuit board (PCB), or a flexible film such as a chip on film (COF).

The power supply unit 330 (or, e.g., a power supply) may be disposed on the circuit board 320 to supply driving voltages to the display driving circuit 310 and the display panel 300. For example, the power supply unit 330 may generate a first driving voltage and supply the first driving voltage to a first driving voltage line, and may generate a second driving voltage and supply the second driving voltage to a second driving voltage line. Further, the power supply unit 330 may generate a third driving voltage and supply the third driving voltage to a cathode electrode of an organic light emitting diode of each of the first and second sub-pixels. For example, the first and second driving voltages may be high-potential voltages for driving a light emitting element, for example, an organic light emitting diode, and the second driving voltage may be a high-potential voltage greater than the first driving voltage. The third driving voltage may be a low-potential voltage for driving the organic light emitting diode.

The touch driving circuit 340 may be disposed on the circuit board 320 to measure capacitances of touch electrodes. For example, the touch driving circuit 340 may determine a user's touch and a user's touch position on the basis of the change in capacitance of the touch electrodes. Here, the user's touch may be an object such as a user's finger or pen that directly contacts one surface of the display device 10 disposed on the touch sensing layer. The touch driving circuit 340 may determine the user's touch position by distinguishing a portion where a user touch occurs from a portion where the user touch does not occur among the plurality of touch electrodes.

The bracket 600 may be disposed under the display panel 300. The bracket 600 may include, for example, plastic, metal, or a combination thereof. For example, the bracket 600 may include a first camera hole CMH1 into which a first camera sensor 720 is inserted, a battery hole BH in which a battery is disposed, and a cable hole CAH through which a cable connected to the display driving circuit 310 or the circuit board 320 passes, and a sensor hole SH in which sensor devices 740, 750, 760, and 770 are disposed. As another example, instead of including the sensor hole SH, the bracket 600 may be formed so as not to overlap the sensor area SDA of the display panel 300.

The main circuit board 700 and a battery 790 may be disposed under the bracket 600. For example, the main circuit board 700 may be a printed circuit board or a flexible printed circuit board.

The main circuit board 700 may include a main processor 710, a first camera sensor 720, a main connector 730, and sensor devices 740, 750, 760, and 770. For example, the first camera sensor 720 may be disposed on both the upper surface and lower surface of the main circuit board 700. In addition, the main processor 710 may be disposed on the upper surface of the main circuit board 700, and the main connector 730 may be disposed on the lower surface of the main circuit board 700. The sensor devices 740, 750, 760, 770 may be disposed on the upper surface of the main circuit board 700.

The main processor 710 may control the functions of the display device 10. For example, the main processor 710 may output digital video data to the display driving circuit 310 such that the display panel 300 displays an image. Further, the main processor 710 may receive touch data from the touch driving circuit 340, determine the touch coordinates of a user, and then execute an application indicated by an icon displayed at the touch coordinates of the user.

The main processor 710 may control the display device 10 according to sensor signals input from the sensor devices 740, 750, 760, and 770. For example, the main processor 710 may determine whether an object is located close the upper surface of the display device 10 according to a proximity sensor signal input from the proximity sensor 740. For example, when the object is located close to the upper surface of the display device 10 in the call mode as detected by the proximity sensor 740, the main processor 710 may not execute an application indicated by an icon displayed at the touch coordinates even if a touch is executed by a user.

The main processor 710 may determine the brightness of the upper surface of the display device 10 according to an illumination sensor signal input from the illumination sensor 750. The main processor 710 may adjust the luminance of an image displayed by the display panel 300 according to the brightness or luminance of incident light on an upper surface of the display device 10.

The main processor 710 may determine whether an iris image of the user is the same as the iris image previously stored in the memory according to an iris sensor signal input from the iris sensor 760. When the iris image of the user is the same as the iris image previously stored in the memory, the main processor 710 may unlock the display device 10 and display a home screen on the display panel 300.

The first camera sensor 720 may process an image frame such as a still image or a moving image obtained by the image sensor, and output the processed image frame to the main processor 710. For example, the first camera sensor 720 may be a CMOS image sensor or a CCD sensor, but the present invention is not limited thereto. The first camera sensor 720 may be exposed to the lower surface of the lower cover 900 by the second camera hole CMH2, and may photograph an object or a background disposed under the display device 10 or outside of the display device 10.

The cable having passed through the cable hole CAH of the bracket 600 may be connected to the main connector 730. Thus, the main circuit board 700 may be electrically connected to the display driving circuit 310 or the circuit board 320.

The sensor devices may include a proximity sensor 740, an illumination sensor 750, an iris sensor 760, and a second camera sensor 770.

The proximity sensor 740 may detect whether an object is located close to the upper surface of the display device 10. For example, the proximity sensor 740 may include a light source that outputs light and a light receiver that receives light reflected by the object. The proximity sensor 740 may determine whether an object located closed to the upper surface of the display device 10 exists according to the amount of light reflected by the object. Since the proximity sensor 740 is disposed to overlap the sensor hole SH, the sensor area SDA of the display panel 300, and the second light transmitting portion DA2 of the cover window 100 in the thickness direction (Z-axis direction) of the display panel 300, the proximity sensor 740 may generate a proximity sensor signal depending on whether the object located closed to the upper surface of the display device 10 exists, and may output the proximity signal to the main processor 710.

The illumination sensor 750 may detect the brightness of the upper surface of the display device 10. The illumination sensor 750 may include a resistor whose resistance value changes depending on the brightness of incident light. The illumination sensor 750 may determine the brightness of the upper surface of the display device 10 depending on the resistance value of the resistor. Since the illumination sensor 750 is disposed to overlap the sensor hole SH, the sensor area SDA of the display panel 300, and the second light transmitting portion DA2 of the cover window 100 in the thickness direction (Z-axis direction) of the display panel 300, the illumination sensor 750 may generate an illumination sensor signal depending on the brightness of the upper surface of the display device 10, and may output the illumination sensor signal to the main processor 710.

The iris sensor 760 may detect whether an image of a user's iris is the same as the iris image previously stored in the memory. The iris sensor 760 may generate an iris sensor signal depending on whether the image of the user's iris is the same as the iris image previously stored in the memory, and may generate the iris sensor signal to the main processor 710.

The second camera sensor 770 may process an image frame such as a still image or a moving image obtained by the image sensor, and output the processed image frame to the main processor 710. For example, the second camera sensor 770 may be a CMOS image sensor or a CCD sensor, but the present invention is not limited thereto. The number of pixels in the second camera sensor 770 may be smaller than the number of pixels in the first camera sensor 720, and the size of the second camera sensor 770 may be smaller than the size of the first camera sensor 720. Since the second camera sensor 770 is disposed to overlap the sensor hole SH, the sensor area SDA of the display panel 300, and the second light transmitting portion DA2 of the cover window 100 in the thickness direction (Z-axis direction) of the display panel 300, the second camera sensor 770 may photograph an object or a background disposed on the display device 10. For example, the second camera sensor 770 may photograph an object or a background facing the front surface (or, e.g., upper surface) of the display device 10.

The battery 790 may be disposed not to overlap the main circuit board 700 in the third direction (Z-axis direction). The battery 790 may overlap the battery hole BH of the bracket 600.

The main circuit board 700 may include a mobile communication module capable of transmitting and receiving a radio signal to/from at least one of a base station, an external terminal, and/or a server. The radio signal may include various types of data depending on a voice signal, a video call signal, or a text/multimedia message transmission/reception.

The lower cover 900 may be disposed under the main circuit board 700 and the battery 790. The lower cover 900 may be engaged and fixed to the bracket 600. The lower cover 900 may form a lower surface of the display device 10. The lower cover 900 may be made of, for example, plastic, metal, or a combination thereof.

The lower cover 900 may include a second camera hole CMH2 through which the lower surface of the first camera sensor 720 is exposed. However, the present invention is not limited to the position of the first camera sensor 720 and the positions of the first and second camera holes CMH1 and CMH2 corresponding to the first camera sensor 720 shown in FIG. 2.

Figure 4:
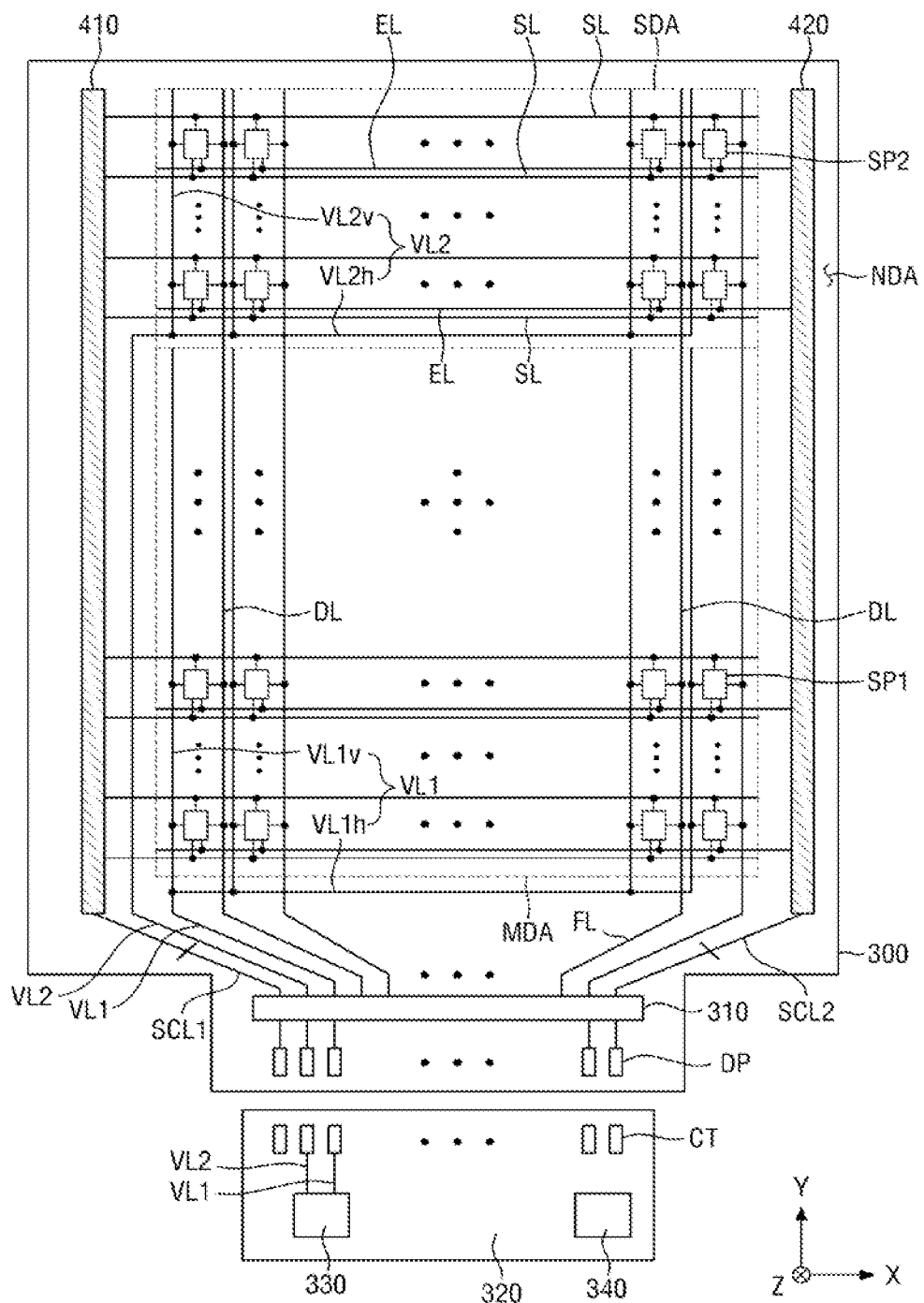
FIG. 4 is a plan view of a display device according to an exemplary embodiment of the present invention.
Figure 5:
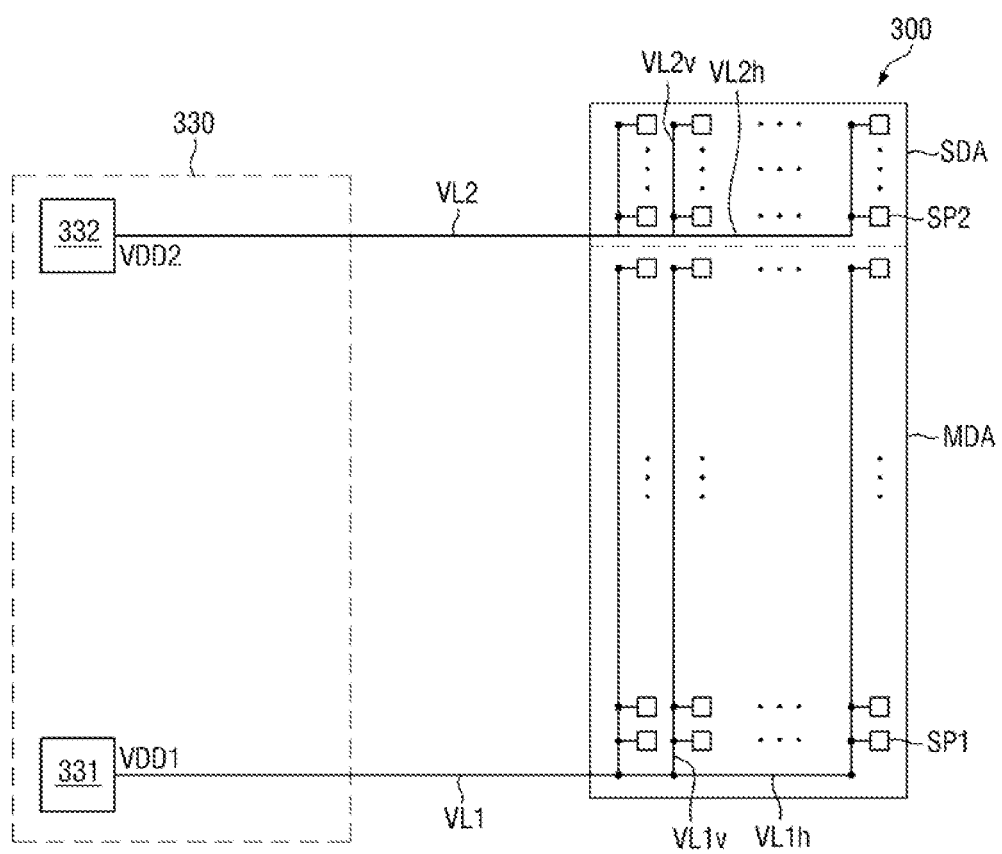
FIG. 5 is a view showing a display panel and a power supply unit of the display device of FIG. 4, according to an exemplary embodiment of the present invention.

FIG. 4 is a plan view of a display device according to an exemplary embodiment of the present invention, and FIG. 5 is a view showing a display panel and a power supply unit of the display device of FIG. 4, according to an exemplary embodiment of the present invention.

Referring to FIGS. 4 and 5, the display panel 300 may include a general area MDA, a sensor area SDA, and a non-display area NDA.

The general area MDA includes first sub-pixels SP1, first voltage supply lines VL1, scan lines SL, and emission control lines EL, and data lines DL. In addition, the first voltage supply lines VL1 are connected to the first sub-pixels SP1.

The first sub-pixels SP1 may be connected to at least one scan line SL, at least one data line DL, at least one emission control line EL, and at least one first voltage supply line VL1. Although it is shown in FIG. 4 that each of the first sub-pixels SP1 may be connected to two scan lines SL, one data line DL, one emission control line EL, and one first vertical voltage supply line VL1v, the present invention is not limited thereto. For example, each of the first sub-pixels SP1 may be connected to three or more scan lines SL.

Each of the first sub-pixels SP1 may include a driving transistor, at least one switching transistor, a light emitting element, and a capacitor. The driving transistor may emit light by supplying a driving current to the light emitting element according to a data voltage applied to a gate electrode. For example, the driving transistor and the at least one switching transistor may be thin film transistors. The light emitting element may emit light having a predetermined luminance according to the magnitude of the driving current of the driving transistor. For example, the light emitting element may be an organic light emitting diode including a first electrode, an organic light emitting layer, and a second electrode. The capacitor may maintain the data voltage applied to the gate electrode of the driving transistor.

The first sub-pixels SP1 may receive a first driving voltage VDD1 through first voltage supply lines VL1. Here, for example, the first driving voltage VDD1 may be a high-potential voltage for driving the light emitting elements of the first sub-pixels SP1.

The first voltage supply line VL1 may include a first horizontal voltage supply line VL1h and a first vertical voltage supply line VL1v.

The first horizontal voltage supply line VL1h may be disposed at one side of the general area MDA. For example, the first horizontal voltage supply line VL1h may be disposed at one side of the general area MDA relatively adjacent to the display driving circuit 310 or the power supply unit 330. For example, the first horizontal voltage supply line VL1h may be disposed at the lower side of the general area MDA, but the present invention is not limited thereto.

The first horizontal voltage supply line VL1h may extend in the first direction (X-axis direction), and may be connected to the plurality of first vertical voltage supply lines VL1v. The first horizontal voltage supply line VL1h may supply the first driving voltage VDD1 supplied from the display driving circuit 310 to the plurality of first vertical voltage supply lines VL1v.

The plurality of first vertical voltage supply lines VL1v may be spaced apart from each other in the first direction (X-axis direction), and may extend in the second direction (Y-axis direction). For example, each of the plurality of first vertical voltage supply lines VL1v may be disposed along a column of first sub-pixels SP1 disposed in the general area MDA. Each of the plurality of first vertical voltage supply lines VL1v may be connected to the first sub-pixels SP1 arranged in the same column, and may supply the first driving voltage VDD1 to the first sub-pixels SP1.

In an exemplary embodiment of the present invention, the first horizontal voltage supply line VL1h and the first vertical voltage supply line VL1v may be disposed on different layers on a substrate of the display panel 300. The first horizontal voltage supply line VL1h may be disposed on a first layer on the substrate, and the first vertical voltage supply line VL1v may be disposed on a second layer, which is disposed on the first layer. The first horizontal voltage supply line VL1h and the first vertical voltage supply line VL1v may be connected to each other through a contact hole. For example, the first horizontal voltage supply line VL1h may be disposed on the same layer as the gate electrode of the thin film transistor on the substrate, and the first vertical voltage supply line VL1v may be disposed on the same layer as the source electrode and drain electrode of the thin film transistor, but the present invention is not limited thereto.

The scan lines SL and the emission control lines EL may extend in the first direction (X-axis direction), and may be spaced apart from each other in the second direction (Y-axis direction) crossing the first direction (X-axis direction). The scan lines SL and the emission control lines EL may be formed in parallel with the first horizontal voltage supply line VL1h.

The data lines DL may extend in the second direction (Y-axis direction), and may be spaced apart from each other in the first direction (X-axis direction). The data lines DL may be formed in parallel with the first vertical voltage supply line VL1v.

The sensor area SDA may include second sub-pixels SP2, second voltage supply lines VL2, scan lines SL, emission control lines EL, and data lines DL.

The second sub-pixels SP2 may be connected to at least one scan line SL, at least one data line DL, at least one emission control line EL, and at least one second voltage supply line VL2. Although it is shown in FIG. 4 that each of the second sub-pixels SP2 may be connected to two scan lines SL, one data line DL, one emission control line EML, and one second vertical voltage supply line VL2v, the present invention is not limited thereto. For example, each of the second sub-pixels SP2 may be connected to three or more scan lines SL.

Each of the second sub-pixels SP2 may include a driving transistor, at least one switching transistor, a light emitting element, and a capacitor.

The second sub-pixels SP2 may receive a second driving voltage VDD2 through second voltage supply lines VL2. Here, for example, the second driving voltage VDD2 may be a high-potential voltage for driving the light emitting elements of the second sub-pixels SP2. The second driving voltage VDD2 may be greater than the first driving voltage VDD1 supplied to the first sub-pixels SP1. The display device 10 may supply the first driving voltage VDD1 to the first sub-pixels SP1 in the first mode and supply the second driving voltage VDD2 to the second sub-pixels SP2 in the first mode, thereby making the luminance of the general area MDA and the luminance of the sensor area SDA substantially uniform.

The number of first sub-pixels SP1 per unit area of the general area MDA may be larger than the number of second sub-pixels SP2 per unit area of the sensor area SDA. The general area MDA is an area for displaying an image, which is a function of the display device 10, and the first sub-pixels SP1 may be densely arranged in the general area MDA. The sensor area SDA may include a pixel area in which the second sub-pixels SP2 are arranged, and a transmission area that transmits light. Accordingly, as the area of the transmission area of the sensor area SDA increases, the number of second sub pixels SP2 per unit area may be smaller than the number of first sub pixels SP1 per unit area.

The magnitude of the second driving voltage VDD2 may be determined according to a ratio of the number of first sub-pixels SP1 per unit area and the number of second sub-pixels SP2 per unit area. For example, when the area of the pixel area of the sensor area SDA is the same as the area of the transmission area of the sensor area SDA, the number of second sub pixels SP2 per unit area may correspond to about half of the number of first sub pixels SP1 per unit area. Thus, the luminance of the sensor area SDA may correspond to about half of the luminance of the general area MDA. Accordingly, the display device 10 may set the magnitude of the second driving voltage VDD2 to be about $2^{(1/2)}$ times or about 1.414 times of the first driving voltage VDD1, thereby making the luminance of the sensor area SDA and the luminance of the general area MDA substantially uniform. The display device 10 may prevent the reduction of the luminance of the sensor area SDA by controlling the magnitude of the second driving voltage VDD2 based on the ratio of the number of the first sub-pixels SP1 and the number of the second sub-pixels SP2.

The second voltage supply line VL2 may include a second horizontal voltage supply line VL2h and a second vertical voltage supply line VL2v.

The second horizontal voltage supply line VL2h may be disposed in the sensor area SDA. For example, the second horizontal voltage supply line VL2h may be disposed at one side of the sensor area SDA. As an additional example, the second horizontal voltage supply line VL2h may be disposed between an upper side of the display panel 300 and an upper side of the general area MDA. As an additional example, the second horizontal voltage supply line VL2h may be disposed between an upper side of the sensor area SDA and the upper side of the general area MDA. For example, the second horizontal voltage supply line VL2h may be disposed at the lower side of the sensor area SDA or the upper side of the general area MDA, but the present invention is not limited thereto.

The second horizontal voltage supply line VL2h may extend in the first direction (X-axis direction), and may be connected to the plurality of second vertical voltage supply lines VL2v. The second horizontal voltage supply line VL2h may supply the second driving voltage VDD2 supplied from the display driving circuit 310 to the plurality of second vertical voltage supply lines VL2v.

The plurality of second vertical voltage supply lines VL2v may be spaced apart from each other in the first direction (X-axis direction) and may extend in the second direction (Y-axis direction). For example, each of the plurality of second vertical voltage supply lines VL2v may be disposed along a column of second sub-pixels SP2 disposed in the sensor area SDA. Each of the plurality of second vertical voltage supply lines VL2v may be connected to the second sub-pixels SP2 arranged in the same column, and may supply the second driving voltage VDD2 to the second sub-pixels SP2.

The second horizontal voltage supply line VL2h and the second vertical voltage supply line VL2v may be disposed on different layers on a substrate of the display panel 300. The second horizontal voltage supply line VL2h may be disposed on a first layer on the substrate, and the second vertical voltage supply line VL2v may be disposed on a second layer, which is disposed on the first layer. The second horizontal voltage supply line VL2h and the second vertical voltage supply line VL2v may be connected to each other through a contact hole. For example, the second horizontal voltage supply line VL2h may be disposed on the same layer as the gate electrode of the thin film transistor on the substrate, and the second vertical voltage supply line VL2v may be disposed on the same layer as the source electrode and drain electrode of the thin film transistor, but the present invention is not limited thereto.

The non-display area NDA may be a remaining area of the display panel 300 except for the general area MDA and the sensor area SDA. The non-display area NDA may include a scan driver 410 for applying scan signals to the scan lines SL, fan-out lines FL for connecting the data lines DL and the display driving circuit 310 to each other, and pads DP connected to the circuit board 320. The display driving circuit 310 and the pads DP may be disposed in the pad area PDA of the display panel 300. The pads DP may be disposed closer to one edge of the pad area PDA than the display driving circuit 310.

The display panel 300 may include a display driving circuit 310, a circuit board 320, a power supply unit 330, a touch driving circuit 340, and a mode selector 350.

The display driving circuit 310 may be connected to the pads to receive digital video data and timing signals. The display driving circuit 310 may convert the digital video data into analog positive/negative data voltages and supply the analog positive/negative data voltages to the data lines DL through the fan-out lines FL.

The display driving circuit 310 may generate a scan control signal and supply the scan control signal to the scan driver 410 through the first scan control lines SCL1. The scan driver 410 may supply scan signals to the first and second sub-pixels SP1 and SP2 based on the scan control signal, and may thus select pixels to which data voltages are to be supplied.

The display driving circuit 310 may generate an emission control signal and supply the emission control signal to an emission control driver 420 through the second scan control lines SCL2. The emission control driver 420 may generate emission signals according to the emission control signal, and sequentially output the emission signals to the emission control lines EL.

For example, the display driving circuit 310 may be formed as an integrated circuit (IC), and may be attached onto the substrate SUB by a chip on glass (COG) method, a chip on plastic (COP) method, or an ultrasonic bonding method. However, the present invention is not limited thereto.

The circuit board 320 may be attached onto the pads using an anisotropic conductive film (ACF). The lead lines of the circuit board 320 may be electrically connected to the pads of the display panel 300. For example, the circuit board 320 may be a flexible printed circuit board (FPCB), a printed circuit board (PCB), or a flexible film such as a chip on film (COF).

The power supply unit 330 may be disposed on the circuit board 320 to supply a driving voltage to the first and second sub-pixels SP1 and SP2. The power supply unit 330 may generate a driving voltage and supply the driving voltage to the first and second sub-pixels SP1 and SP2 of the display panel 300, the display driving circuit 310, the scan driver 410, and the emission control driver 420.

The power supply unit 330 may include a first driving voltage generator 331 and a second driving voltage generator 332.

The first driving voltage generator 331 may generate a first driving voltage VDD1 and supply the first driving voltage VDD1 to the first voltage supply line VL1. The first voltage supply line VL1 may be connected to the display driving circuit 310 from the first driving voltage generator 331, and may be connected to the first sub-pixels SP1 from the display driving circuit 310. Accordingly, the first sub-pixels SP1 may receive the first driving voltage VDD1 through the first voltage supply line VL1.

The second driving voltage generator 332 may generate a second driving voltage VDD2 and supply the second driving voltage VDD2 to the second voltage supply line VL2. The second voltage supply line VL2 may be connected to the display driving circuit 310 from the second driving voltage generator 332, and may be connected to the second sub-pixels SP2 from the display driving circuit 310. Accordingly, the second sub-pixels SP2 may receive the second driving voltage VDD2 through the second voltage supply line VL2.

Accordingly, the power supply unit 330 may supply the first driving voltage VDD1 to the first sub pixels SP1 and supply the second driving voltage VDD2 to the second sub pixels SP2, thereby making the luminance of the general area MDA and the luminance of the sensor area SDA substantially uniform.

In addition, the power supply unit 330 may generate driving voltages for driving the display driving circuit 310, the scan driver 410, and the emission control driver 420, for example, a display driving voltage, a gate high voltage, and a gate low voltage. Further, the power supply unit 330 may supply these driving voltages to the display driving circuit 310.

The touch driving circuit 340 may be disposed on the circuit board 320 to measure capacitances of touch electrodes. For example, the touch driving circuit 340 may determine a user's touch and a user's touch position on the basis of the change in capacitance of the touch electrodes. Here, the user's touch means that an object such as a user's finger or pen directly contacts one surface of the display device 10 disposed on a touch sensing layer. The touch driving circuit 340 may determine the user's touch position by distinguishing a portion where a user's touch occurs from a portion where the user's touch does not occur among the plurality of touch electrodes.

As shown in FIG. 4, the scan driver 410 may be disposed outside one side of the general area MDA and one side the sensor area SDA or may be disposed at one side of the non-display area NDA. For example, the scan driver 410 may be disposed adjacent to one side of the general area MDA and one side of the sensor area SDA while disposed in the non-display area NDA. The emission control driver 420 may be disposed outside the other side of the general area MDA and the other side of the sensor area SDA or may be disposed at the other side of the non-display area NDA. For example, the emission control driver 420 may be disposed adjacent to the other side of the general area MDA and the other side of the sensor area SDA while disposed in the non-display area NDA. As another example, both the scan driver 410 and the emission control driver 420 may be disposed outside one side of the general area MDA and one side the sensor area SDA. As an additional example, the scan driver 410 and the emission control driver 420 may be respectively disposed at opposing sides of the non-display area NDA.

The scan driver 410 may include a plurality of thin film transistors for generating scan signals according to the scan control signal, and the emission control driver 420 may include a plurality of thin film transistors for generating emission signals according to the emission control signal. For example, the thin film transistors of the scan driver 410 and the thin film transistors of the emission control driver 420 may be formed on the same layer as the thin film transistors of each of the first and second sub-pixels SP1 and SP2.

For example, the first horizontal voltage supply line VL1*h* and the second horizontal voltage supply line VL2*h* may be disposed on the same layer as the gate electrode of the thin film transistor of the scan driver 410 or the emission control driver 420. For example, the first vertical voltage supply line VL1*v* and the second vertical voltage supply line VL2*v* may be disposed on the same layer as the source electrode and drain electrode of the thin film transistor of the scan driver 410 or the emission control driver 420.

Figure 6:
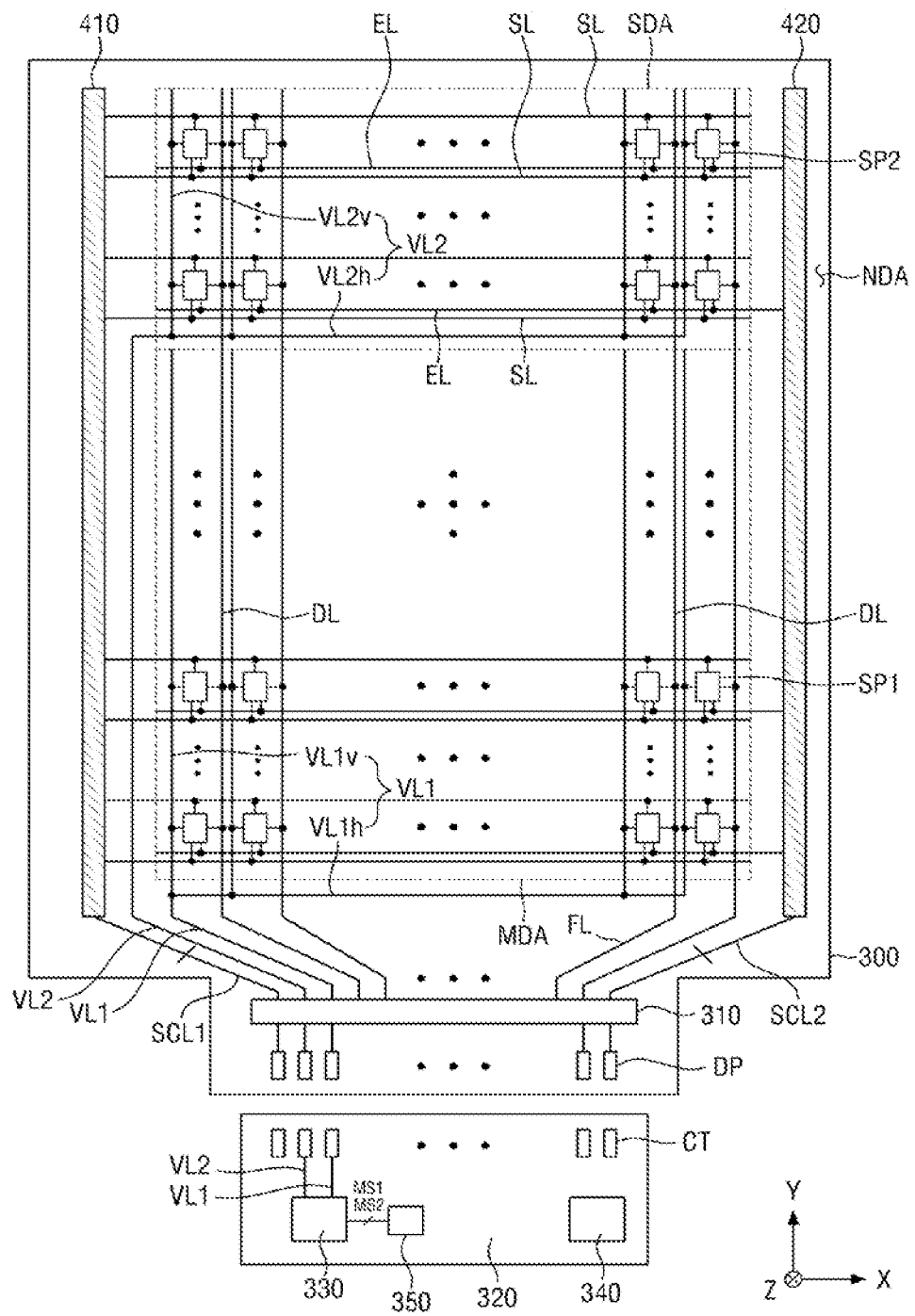
FIG. 6 is a detailed plan view of a display device according to an exemplary embodiment of the present invention.
Figure 7:
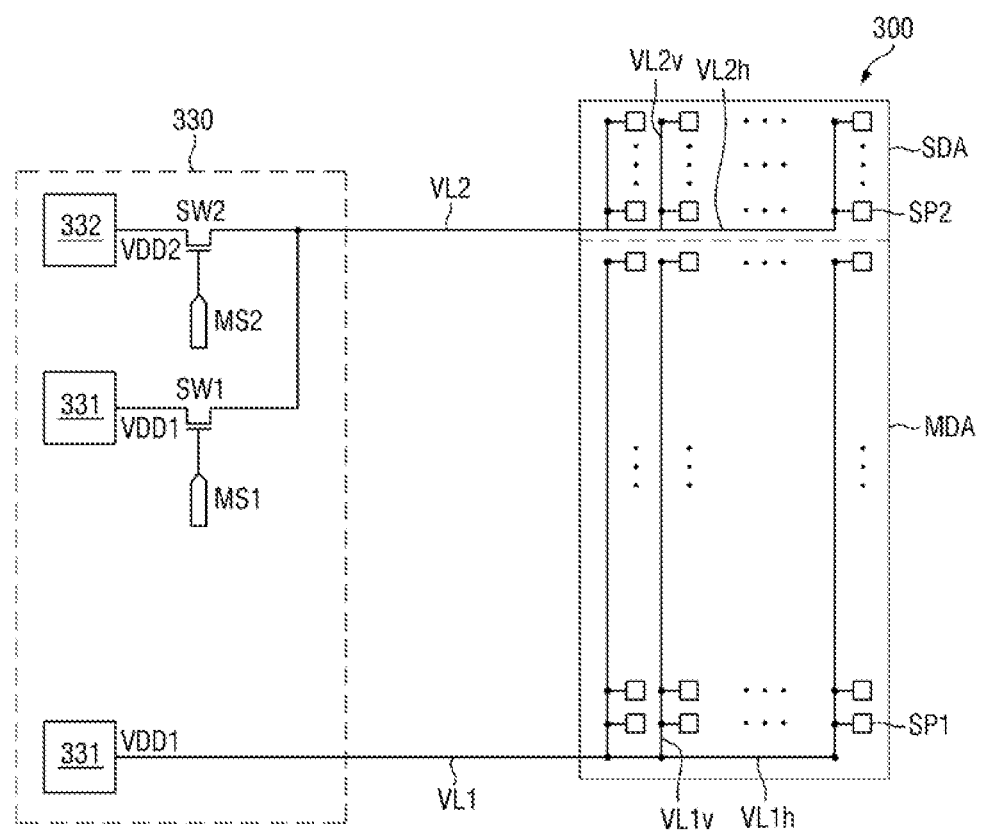
FIG. 7 is a view showing a display panel and a power supply unit of the display device of FIG. 6, according to an exemplary embodiment of the present invention.

FIG. 6 is a plan view of a display device according to an exemplary embodiment of the present invention, and FIG. 7 is a view showing a display panel and a power supply unit of the display device of FIG. 6, according to an exemplary embodiment of the present invention. The display device of FIGS. 6 and 7 is different from the aforementioned display device in that the configuration of the power supply unit is different and a mode selector 250 is further provided. Therefore, configurations that are the same as the above-described configurations may be briefly described or omitted.

Referring to FIGS. 6 and 7, the display panel 300 may include a general area MDA, a sensor area SDA, and a non-display area NDA.

The general area MDA includes first sub-pixels SP1, first voltage supply lines VL1, scan lines SL, and emission control lines EML, and data lines DL. In addition, the first voltage supply lines VL1 are connected to the first sub-pixels SP1.

The first sub-pixels SP1 may receive a first driving voltage VDD1 through first voltage supply lines VL1. Here, the first driving voltage VDD1 may be a high-potential voltage for driving the light emitting elements of the first sub-pixels SP1.

The first voltage supply line VL1 may include a first horizontal voltage supply line VL1*h* and a first vertical voltage supply line VL1*v*.

The first horizontal voltage supply line VL1*h* may be disposed at one side of the general area MDA. For example, the first horizontal voltage supply line VL1*h* may be disposed at one side of the general area MDA relatively adjacent to the display driving circuit 310 or the power supply unit 330. For example, the first horizontal voltage supply line VL1*h* may be disposed at the lower side of the general area MDA, but the present invention is not limited thereto.

The first horizontal voltage supply line VL1*h* may extend in the first direction (X-axis direction), and may be connected to the plurality of first vertical voltage supply lines VL1*v*. The first horizontal voltage supply line VL1*h* may supply the first driving voltage VDD1 supplied from the display driving circuit 310 to the plurality of first vertical voltage supply lines VL1*v*.

The plurality of first vertical voltage supply lines VL1*v* may be spaced apart from each other in the first direction (X-axis direction), and may extend in the second direction (Y-axis direction). For example, each of the plurality of first vertical voltage supply lines VL1*v* may be disposed along a column of first sub-pixels SP1 disposed in the general area MDA. Each of the plurality of first vertical voltage supply lines VL1*v* may be connected to the first sub-pixels SP1 arranged in the same column, and may supply the first driving voltage VDD1 to the first sub-pixels SP1.

The sensor area SDA may include second sub-pixels SP2, second voltage supply lines VL2, scan lines SL, and emission control lines EML, and data lines DL. In addition, the second voltage supply lines VL2 are connected to the second sub-pixels SP2.

The second sub-pixels SP2 may receive a first driving voltage VDD1 or a second driving voltage VDD2 through second voltage supply lines VL2. Here, the first driving voltage VDD1 may be a high-potential voltage for driving the light emitting elements of the second sub-pixels SP2 in the first mode or the power saving mode, and the second driving voltage VDD2 may be a high-potential voltage for driving the light emitting elements of the second sub-pixels SP2 in the second mode or the general mode (e.g., a normal operational mode). The second driving voltage VDD2 may be greater than the first driving voltage VDD1. The display device 10 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

The second voltage supply line VL2 may include a second horizontal voltage supply line VL2h and a second vertical voltage supply line VL2v.

The second horizontal voltage supply line VL2h may be disposed at one side of the sensor area SDA. For example, the second horizontal voltage supply line VL2h may be disposed between the sensor area SDA and the general area MDA. For example, the second horizontal voltage supply line VL2h may be disposed at the lower side of the sensor area SDA or the upper side of the general area MDA, but the present invention is not limited thereto.

The second horizontal voltage supply line VL2h may extend in the first direction (X-axis direction), and may be connected to the plurality of second vertical voltage supply lines VL2v. The second horizontal voltage supply line VL2h may supply the first driving voltage VDD1 or second driving voltage VDD2 supplied from the display driving circuit 310 to the plurality of second vertical voltage supply lines VL2v.

The plurality of second vertical voltage supply lines VL2v may be spaced apart from each other in the first direction (X-axis direction) and may extend in the second direction (Y-axis direction). For example, each of the plurality of second vertical voltage supply lines VL2v may be disposed along a column of second sub-pixels SP2 disposed in the sensor area SDA. Each of the plurality of second vertical voltage supply lines VL2v may be connected to the second sub-pixels SP2 arranged in the same column, and may supply the first or second driving voltage VDD1 or VDD2 to the second sub-pixels SP2.

The second horizontal voltage supply line VL2h and the second vertical voltage supply line VL2v may be disposed on different layers on a substrate of the display panel 300. The second horizontal voltage supply line VL2h may be disposed on a first layer on the substrate, and the second vertical voltage supply line VL2v may be disposed on a second layer disposed on the first layer. The second horizontal voltage supply line VL2h and the second vertical voltage supply line VL2v may be connected to each other through a contact hole. For example, the second horizontal voltage supply line VL2h may be disposed on the same layer as the gate electrode of the thin film transistor on the substrate, and the second vertical voltage supply line VL2v may be disposed on the same layer as the source electrode and drain electrode of the thin film transistor, but the present invention is not limited thereto.

The display panel 300 may include a display driving circuit 310, a circuit board 320, a power supply unit 330, a touch driving circuit 340, and a mode selector 350.

The power supply unit 330 may be disposed on the circuit board 320 to supply a driving voltage to the first and second sub-pixels SP1 and SP2. The power supply unit 330 may generate a driving voltage and supply the driving voltage to the first and second sub-pixels SP1 and SP2 of the display panel 300, the display driving circuit 310, the scan driver 410, and the emission control driver 420.

The power supply unit 330 may include a first driving voltage generator 331 and a second driving voltage generator 332, a first switching element SW1, and a second switching element SW2.

The first driving voltage generator 331 may generate a first driving voltage VDD1 and supply the first driving voltage VDD1 to the first voltage supply line VL1. The first voltage supply line VL1 may be connected to the display driving circuit 310 from the first driving voltage generator 331, and may be connected to the first sub-pixels SP1 from the display driving circuit 310. Accordingly, the first sub-pixels SP1 may receive the first driving voltage VDD1 through the first voltage supply line VL1.

The first driving voltage generator 331 may generate a first driving voltage VDD1 and supply the first driving voltage VDD1 to the first switching element SW1. The first switching element SW1 may selectively supply the first driving voltage VDD1 to the second voltage supply line VL2 based on a first mode signal MS1. For example, the first switching element SW1 may receive the first mode signal MS1 from the mode selector 350 to be turned on. The mode selector 350 may supply the first mode signal MS1 to the first switching element SW1 of the power supply unit 330 in the first mode or the power saving mode. Accordingly, the second sub-pixels SP2 may receive the first driving voltage VDD1 through the second voltage supply line VL2 in the first mode.

The second driving voltage generator 332 may generate a second driving voltage VDD2 and supply the second driving voltage VDD2 to the second switching element SW2. The second switching element SW2 may selectively supply the second driving voltage VDD2 to the second voltage supply line VL2 connected to the second sub-pixels SP2 based on a second mode signal MS2. For example, the second switching element SW2 may receive the second mode signal MS2 from the mode selector 350 to be turned on. The mode selector 350 may supply the second mode signal MS2 to the second switching element SW2 of the power supply unit 330 in the second mode or the general mode. Accordingly, the second sub-pixels SP2 may receive the second driving voltage VDD2 through the second voltage supply line VL2 in the second mode.

Accordingly, the power supply unit may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

The mode selector 350 may be disposed on the circuit board 320 to supply the first or second mode signals MS1 or MS2 to the power supply unit 330. For example, the mode selector 350 may supply the first mode signal MS1 to the first switching element SW1 in the first mode, and may supply the second mode signal MS2 to the second switching element SW2 in the second mode.

Figure 8:
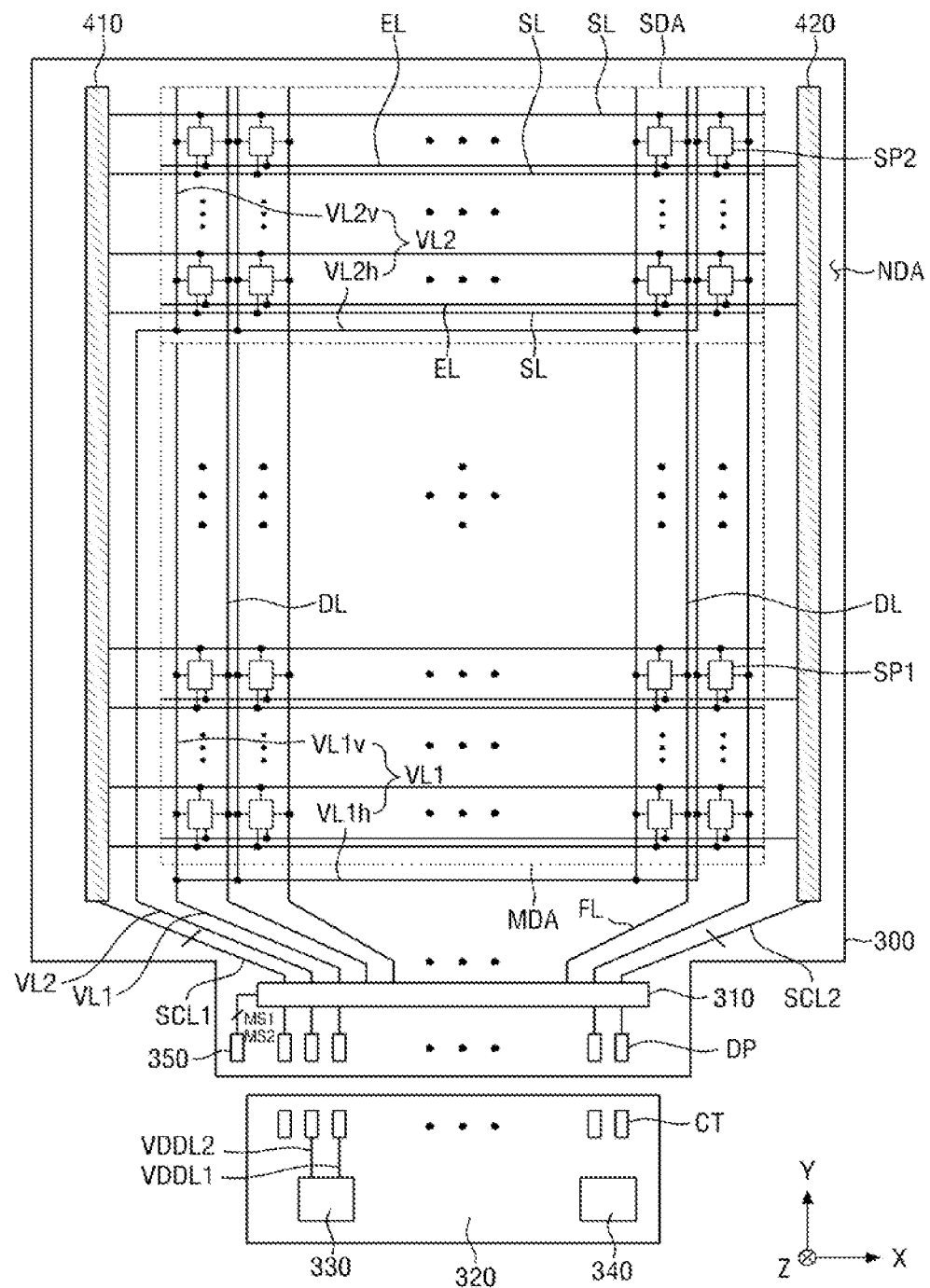
FIG. 8 is a plan view of a display device according to an exemplary embodiment of the present invention.
Figure 9:
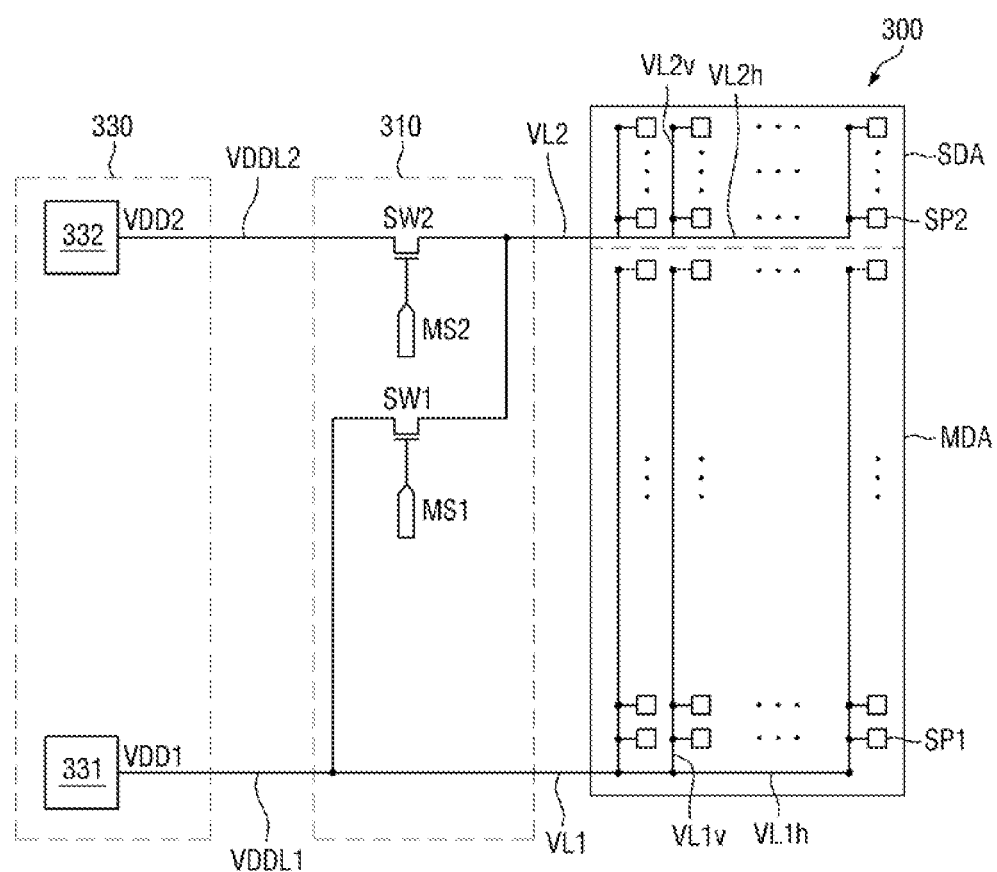
FIG. 9 is a view showing a display panel, a display driving circuit and a power supply unit of the display device of FIG. 8, according to an exemplary embodiment of the present invention.

FIG. 8 is a plan view of a display device according to an exemplary embodiment of the present invention, and FIG. 9 is a view showing a display panel, a display driving circuit and a power supply unit of the display device of FIG. 8, according to an exemplary embodiment of the present invention. The display device of FIGS. 8 and 9 is different from the aforementioned display device in that the configuration of supplying first and second driving voltages VDD1 and VDD2 is different. Therefore, configurations that are the same as the above-described configurations may be briefly described or omitted.

Referring to FIGS. 8 and 9, the display panel 300 may include a general area MDA, a sensor area SDA, and a non-display area NDA.

The general area MDA includes first sub-pixels SP1, first voltage supply lines VL1, scan lines SL, and emission control lines EML, and data lines DL. In addition, the first voltage supply lines VL1 are connected to the first sub-pixels SP1.

The first sub-pixels SP1 may receive a first driving voltage VDD1 through first voltage supply lines VL1. Here, the first driving voltage VDD1 may be a high-potential voltage for driving the light emitting elements of the first sub-pixels SP1. The first voltage supply line VL1 may include a first horizontal voltage supply line VL1*h* and a first vertical voltage supply line VL1*v*.

The sensor area SDA may include second sub-pixels SP2, second voltage supply lines VL2, scan lines SL, and emission control lines EML, and data lines DL. In addition, the second voltage supply lines VL2 are connected to the second sub-pixels SP2.

The second sub-pixels SP2 may receive a first driving voltage VDD1 or a second driving voltage VDD2 through second voltage supply lines VL2. Here, the first driving voltage VDD1 may be a high-potential voltage for driving the light emitting elements of the second sub-pixels SP2 in the first mode or the power saving mode, and the second driving voltage VDD2 may be a high-potential voltage for driving the light emitting elements of the second sub-pixels SP2 in the second mode or the general mode. The second driving voltage VDD2 may be greater than the first driving voltage VDD1. The display device 10 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform. The second voltage supply line VL2 may include a second horizontal voltage supply line VL2*h* and a second vertical voltage supply line VL2*v*.

The magnitude of the second driving voltage VDD2 may be determined according to a ratio of the number of first sub-pixels SP1 per unit area to the number of second sub-pixels SP2 per unit area. For example, when the area of the pixel area of the sensor area SDA is the same as the area of the transmission area of the sensor area SDA, the number of second sub pixels SP2 per unit area may correspond to half of the number of first sub pixels SP1 per unit area. Thus, the luminance of the sensor area SDA may correspond to half of the luminance of the general area MDA. Accordingly, the display device 10 may set the magnitude of the second driving voltage VDD2 to be $2^{(1/2)}$ times or 1.414 times of the first driving voltage VDD1, thereby making the luminance of the sensor area SDA and the luminance of the general area MDA substantially uniform. The display device 10 may prevent the reduction of the luminance of the sensor area by controlling the magnitude of the second driving voltage VDD2 based on the ratio of the number of the first sub-pixels SP1 and the number of the second sub-pixels SP2.

The display panel 300 may include a display driving circuit 310, a circuit board 320, a power supply unit 330, a touch driving circuit 340, and a mode selector 350.

The display driving circuit 310 may include a first switching element SW1 and a second switching element SW2, and the power supply unit 330 may include a first driving voltage generator 331 and a second driving voltage generator 332. The display driving circuit 310 may receive the first driving voltage VDD1 through the first driving voltage supply line VDDL1 and receive the second driving voltage VDD2 through the second driving voltage supply line VDDL2.

The first driving voltage generator 331 may generate a first driving voltage VDD1 and supply the first driving voltage VDD1 to the first driving voltage supply line VDDL1. The first driving voltage supply line VDDL1 may be connected to the display driving circuit 310 from the first driving voltage generator 331, and the first voltage supply line VL1 may be connected to the first sub pixels SP1 from the display driving circuit 310. Accordingly, the first sub-pixels SP1 may receive the first driving voltage VDD1 through the first voltage supply line VL1.

The first driving voltage generator 331 may be connected to the first switching element SW1 of the display driving circuit 310 through the first driving voltage supply line VDDL1. The first driving voltage generator 331 may generate a first driving voltage VDD1 and supply the first driving voltage VDD1 to the first switching element SW1. The first switching element SW1 may selectively supply the first driving voltage VDD1 to the second voltage supply line VL2 based on a first mode signal MS1. For example, the first switching element SW1 may receive the first mode signal MS1 from the mode selector 350 to be turned on. The mode selector 350 may supply the first mode signal MS1 to the first switching element SW1 of the display driving circuit 310 in the first mode or the power saving mode. Accordingly, the second sub-pixels SP2 may receive the first driving voltage VDD1 through the second voltage supply line VL2 in the first mode.

The second driving voltage generator 332 may be connected to the second switching element SW2 of the display driving circuit 310 through the second driving voltage supply line VDDL2. The second driving voltage generator 332 may generate a second driving voltage VDD2 and supply the second driving voltage VDD2 to the second switching element SW2. The second switching element SW2 may selectively supply the second driving voltage VDD2 to the second voltage supply line VL2 based on a second mode signal MS2. For example, the second switching element SW2 may receive the second mode signal MS2 from the mode selector 350 to be turned on. The mode selector 350 may supply the second mode signal MS2 to the second switching element SW2 of the display driving circuit 310 in the second mode or the general mode. Accordingly, the second sub-pixels SP2 may receive the second driving voltage VDD2 through the second voltage supply line VL2 in the second mode.

Accordingly, the display driving circuit 310 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

The mode selector 350 may be disposed in the protrusion area PA of the display panel 300 to supply the first or second mode signals MS1 or MS2 to the display driving circuit 310. For example, when the display driving circuit 310 is disposed in the non-display area NDA of the display panel 300, the mode selector 350 may also be disposed in the non-display area NDA.

The mode selector 350 may supply the first mode signal MS1 to the first switching element SW1 in the first mode, and supply the second mode signal MS2 to the second switching element SW2 in the second mode, thereby controlling the driving mode of the display device 10.

Figure 10:
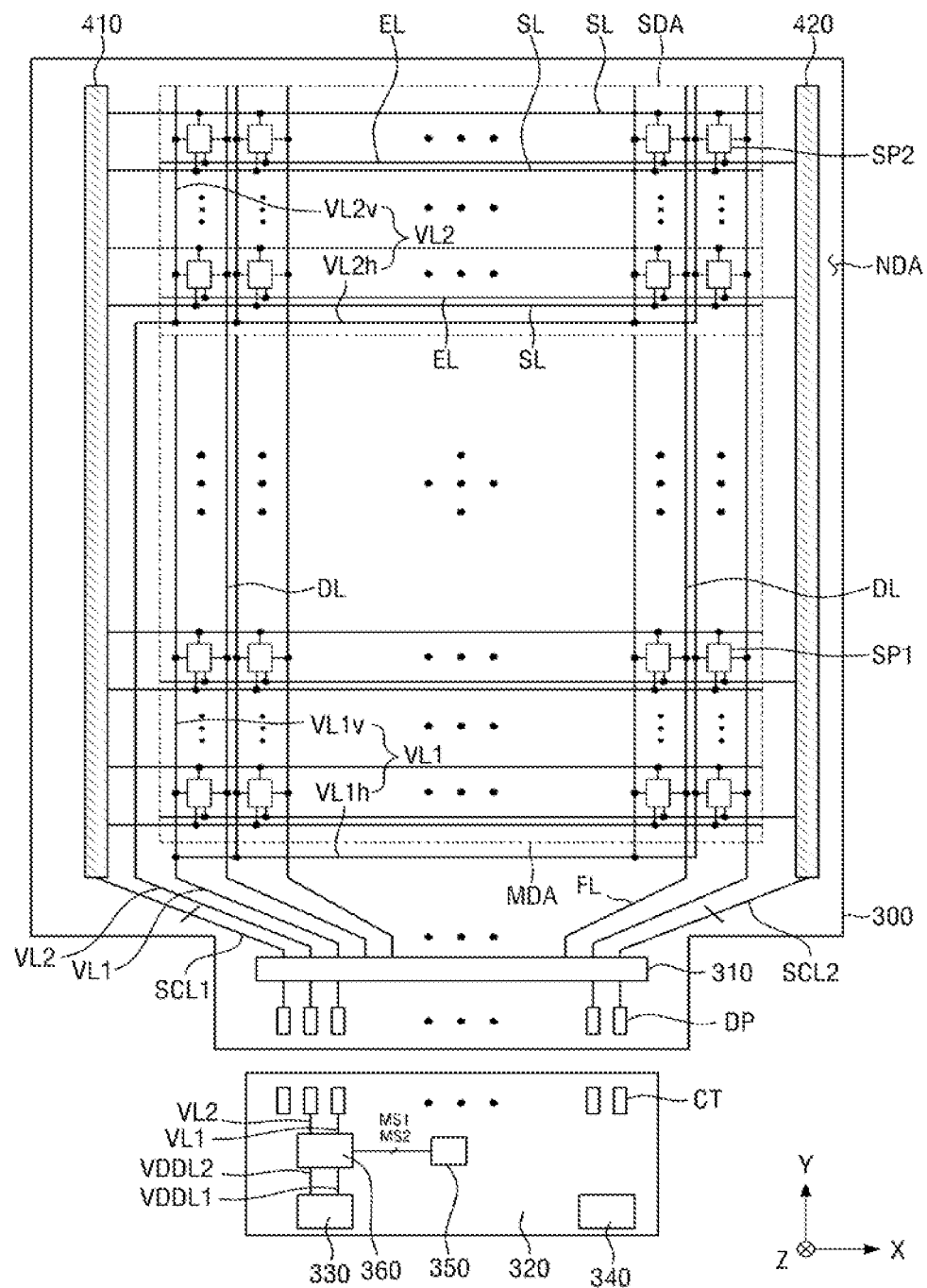
FIG. 10 is a plan view of a display device according to exemplary embodiment of the present invention.
Figure 11:
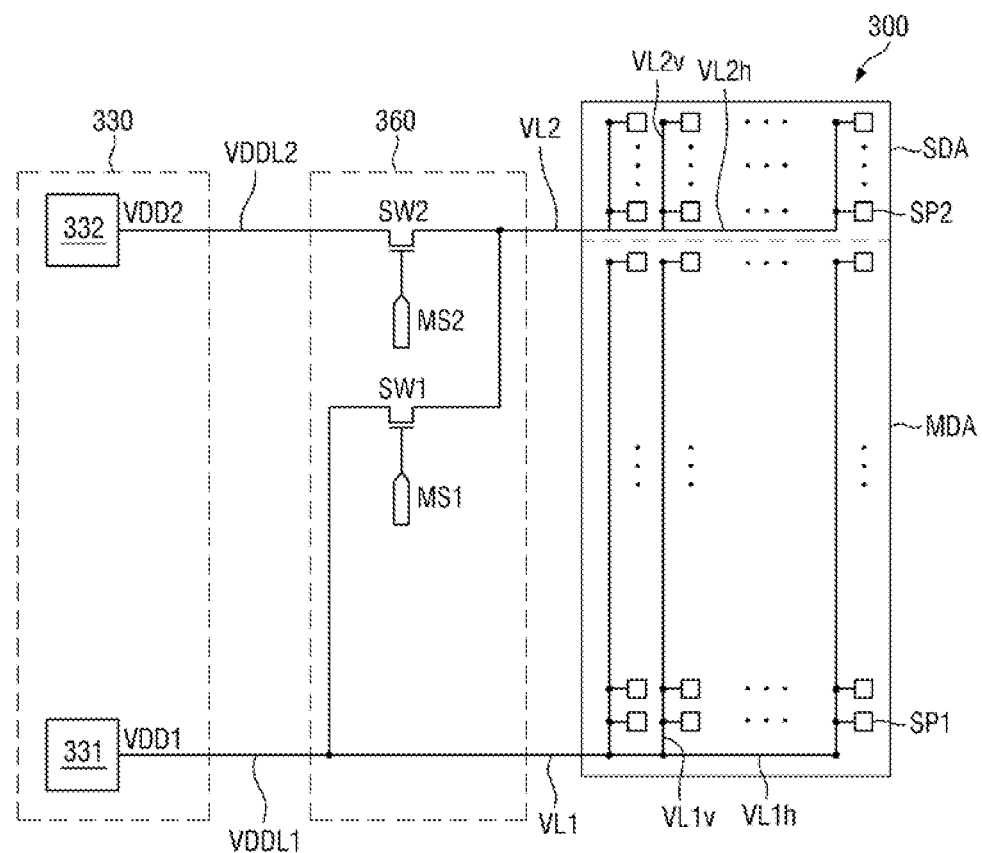
FIG. 11 is a view showing a display panel, a power supply unit and a first switching unit of the display device of FIG. 10, according to an exemplary embodiment of the present invention.

FIG. 10 is a plan view of a display device according to exemplary embodiment of the present invention, and FIG. 11 is a view showing a display panel, a power supply unit and a first switching unit of the display device of FIG. 10, according to an exemplary embodiment of the present invention. The display device of FIGS. 10 and 11 is different from the aforementioned display device in that the configuration of supplying first and second driving voltages VDD1 and VDD2 is different. Therefore, configurations that are the same as the above-described configurations may be briefly described or omitted.

Referring to FIGS. 10 and 11, the display panel 300 may include a general area MDA, a sensor area SDA, and a non-display area NDA.

The general area MDA includes first sub-pixels SP1, first voltage supply lines VL1, scan lines SL, and emission control lines EML, and data lines DL. In addition, the first voltage supply lines VL1 are connected to the first sub-pixels SP1.

The first sub-pixels SP1 may receive a first driving voltage VDD1 through first voltage supply lines VL1. Here, the first driving voltage VDD1 may be a high-potential voltage for driving the light emitting elements of the first sub-pixels SP1. The first voltage supply line VL1 may include a first horizontal voltage supply line VL1h and a first vertical voltage supply line VL1v.

The sensor area SDA may include second sub-pixels SP2, second voltage supply lines VL2, scan lines SL, and emission control lines EML, and data lines DL. In addition, the second voltage supply lines VL2 are connected to the second sub-pixels SP2.

The second sub-pixels SP2 may receive a first driving voltage VDD1 or a second driving voltage VDD2 through second voltage supply lines VL2. Here, the first driving voltage VDD1 may be a high-potential voltage for driving the light emitting elements of the second sub-pixels SP2 in the first mode or the power saving mode, and the second driving voltage VDD2 may be a high-potential voltage for driving the light emitting elements of the second sub-pixels SP2 in the second mode or the general mode. The second driving voltage VDD2 may be greater than the first driving voltage VDD1. The display device 10 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform. The second voltage supply line VL2 may include a second horizontal voltage supply line VL2h and a second vertical voltage supply line VL2v.

The magnitude of the second driving voltage VDD2 may be determined according to a ratio of the number of first sub-pixels SP1 per unit area to the number of second sub-pixels SP2 per unit area. For example, when the area of the pixel area of the sensor area SDA is substantially the same as the area of the transmission area of the sensor area SDA, the number of second sub pixels SP2 per unit area may correspond to about half of the number of first sub pixels SP1 per unit area. Thus, the luminance of the sensor area SDA may correspond to about half of the luminance of the general area MDA. Accordingly, the display device 10 may set the magnitude of the second driving voltage VDD2 to be about $2^{(1/2)}$ times or about 1.414 times of the first driving voltage VDD1, thereby making the luminance of the sensor area SDA and the luminance of the general area MDA substantially uniform. The display device 10 may prevent the reduction of the luminance of the sensor area by controlling the magnitude of the second driving voltage VDD2 based on the ratio of the number of the first sub-pixels SP1 to the number of the second sub-pixels SP2.

The display panel 300 may include a display driving circuit 310, a circuit board 320, a power supply unit 330, a touch driving circuit 340, a mode selector 350, and a first switching unit 360.

The power supply unit 330 may include a first driving voltage generator 331 and a second driving voltage generator 332, and the first switching unit 360 may include a first switching element SW1 and a second switching element SW2. The first switching unit 360 may receive the first driving voltage VDD1 through the first driving voltage supply line VDDL1 and receive the second driving voltage VDD2 through the second driving voltage supply line VDDL2.

For example, the power supply unit 330 and the first switching unit 360 may be mounted on the circuit board 320, but the present invention is not limited thereto.

The first driving voltage generator 331 may generate a first driving voltage VDD1 and supply the first driving voltage VDD1 to the first driving voltage supply line VDDL1. The first driving voltage supply line VDDL1 may be connected to the first switching unit 360 from the first driving voltage generator 331, and the first voltage supply line VL1 may be connected to the first sub pixels SP1 from the first switching unit 360. Accordingly, the first sub-pixels SP1 may receive the first driving voltage VDD1 through the first voltage supply line VL1.

The first driving voltage generator 331 may be connected to the first switching element SW1 of the first switching unit 360 through the first driving voltage supply line VDDL1. The first driving voltage generator 331 may generate a first driving voltage VDD1 and supply the first driving voltage VDD1 to the first switching element SW1 through the first driving voltage supply line VDDL1. The first switching element SW1 may selectively supply the first driving voltage VDD1 to the second voltage supply line VL2 based on a first mode signal MS1. For example, the first switching element SW1 may receive the first mode signal MS1 from the mode selector 350 to be turned on. The mode selector 350 may supply the first mode signal MS1 to the first switching element SW1 of the first switching unit 360 in the first mode or the power saving mode. Accordingly, the second sub-pixels SP2 may receive the first driving voltage VDD1 through the second voltage supply line VL2 in the first mode.

The second driving voltage generator 332 may be connected to the second switching element SW2 of the first switching unit 360 through the second driving voltage supply line VDDL2. The second driving voltage generator 332 may generate a second driving voltage VDD2 and supply the second driving voltage VDD2 to the second switching element SW2 through the second driving voltage supply line VDDL2. The second switching element SW2 may selectively supply the second driving voltage VDD2 to the second voltage supply line VL2 based on a second mode signal MS2. For example, the second switching element SW2 may receive the second mode signal MS2 from the mode selector 350 to be turned on. The mode selector 350 may supply the second mode signal MS2 to the second switching element SW2 of the first switching unit 360 in the second mode or the general mode. Accordingly, the second sub-pixels SP2 may receive the second driving voltage VDD2 through the second voltage supply line VL2 in the second mode.

Accordingly, the first switching unit 360 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

Figure 12:
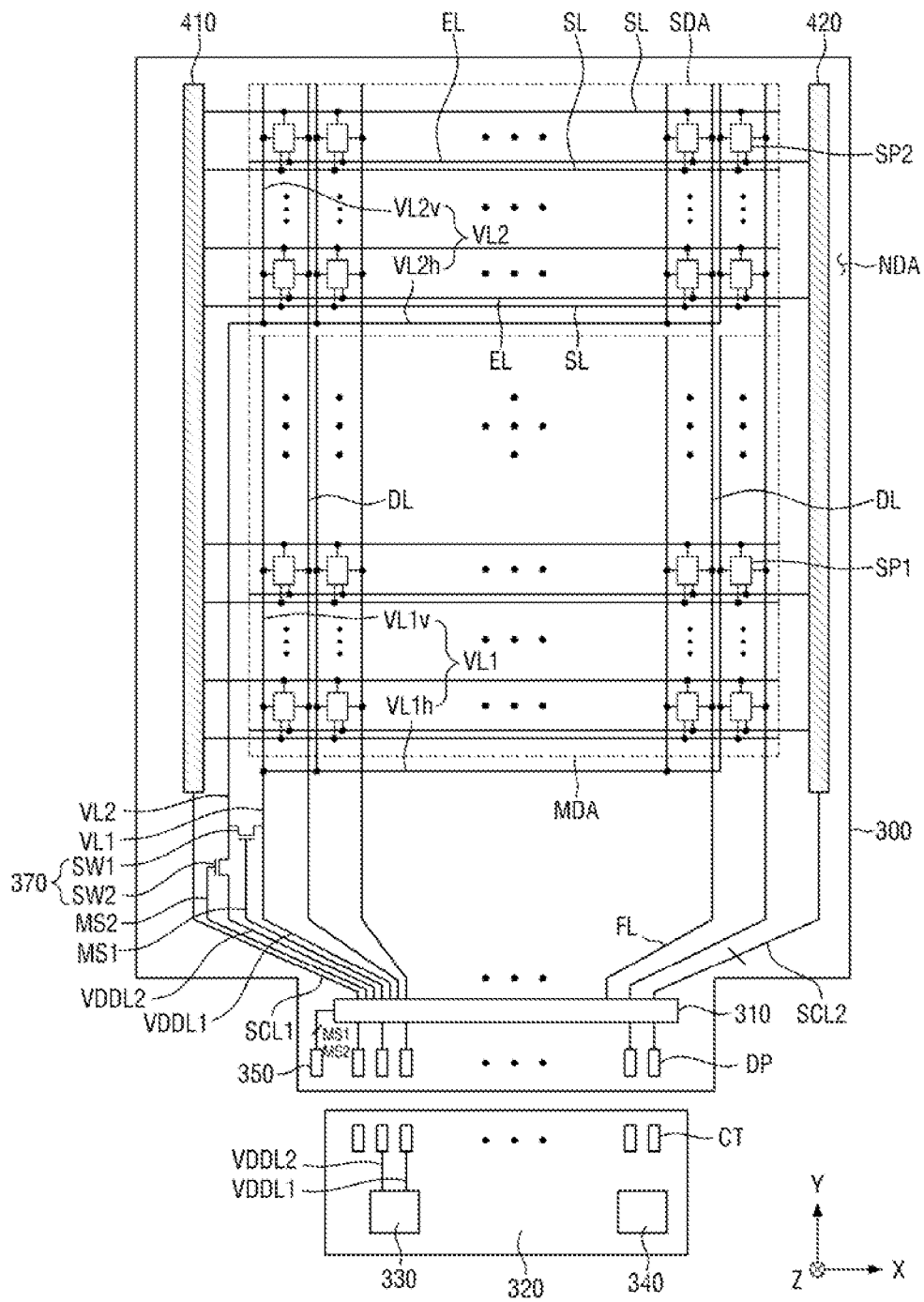
FIG. 12 is a plan view of a display device according to an exemplary embodiment of the present invention.

FIG. 12 is a plan view of a display device according to an exemplary embodiment of the present invention. The display device of FIG. 12 is different from the aforementioned display device in that the configuration of supplying first and second driving voltages VDD1 and VDD2 is different. Therefore, configurations that are the same as the above-described configurations may be briefly described or omitted.

Referring to FIG. 12, the display panel 300 may include a general area MDA, a sensor area SDA, and a non-display area NDA.

The general area MDA includes first sub-pixels SP1, first voltage supply lines VL1, scan lines SL, and emission control lines EL, and data lines DL. In addition, the first voltage supply lines VL1 are connected to the first sub-pixels SP1.

The first sub-pixels SP1 may receive a first driving voltage VDD1 through first voltage supply lines VL1. Here, the first driving voltage VDD1 may be a high-potential voltage for driving the light emitting elements of the first sub-pixels SP1. The first voltage supply line VL1 may include a first horizontal voltage supply line VL1$h$ and a first vertical voltage supply line VL1$v$.

The sensor area SDA may include second sub-pixels SP2, second voltage supply lines VL2, scan lines SL, and emission control lines EL, and data lines DL. In addition, the second voltage supply lines VL2 are connected to the second sub-pixels SP2

The second sub-pixels SP2 may receive a first driving voltage VDD1 or a second driving voltage VDD2 through second voltage supply lines VL2. Here, the first driving voltage VDD1 may be a high-potential voltage for driving the light emitting elements of the second sub-pixels SP2 in the first mode or the power saving mode, and the second driving voltage VDD2 may be a high-potential voltage for driving the light emitting elements of the second sub-pixels SP2 in the second mode or the general mode. The second driving voltage VDD2 may be greater than the first driving voltage VDD1. The display device 10 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform. The second voltage supply line VL2 may include a second horizontal voltage supply line VL2$h$ and a second vertical voltage supply line VL2$v$.

The magnitude of the second driving voltage VDD2 may be determined according to a ratio of the number of first sub-pixels SP1 per unit area to the number of second sub-pixels SP2 per unit area. For example, when the area of the pixel area of the sensor area SDA is substantially the same as the area of the transmission area of the sensor area SDA, the number of second sub pixels SP2 per unit area may correspond to about half of the number of first sub pixels SP1 per unit area. Thus, the luminance of the sensor area SDA may correspond to about half of the luminance of the general area MDA. Accordingly, the display device 10 may set the magnitude of the second driving voltage VDD2 to be about $2^{(1/2)}$ times or about 1.414 times of the first driving voltage VDD1, thereby making the luminance of the sensor area SDA and the luminance of the general area MDA substantially uniform. The display device 10 may prevent the reduction of the luminance of the sensor area by controlling the magnitude of the second driving voltage VDD2 based on the ratio of the number of the first sub-pixels SP1 to the number of the second sub-pixels SP2.

The display panel 300 may include a display driving circuit 310, a circuit board 320, a power supply unit 330, a touch driving circuit 340, a mode selector 350, and a second switching unit 370.

The power supply unit 330 may include a first driving voltage generator 331 and a second driving voltage generator 332, and the second switching unit 370 may include a first switching element SW1 and a second switching element SW2. The second switching unit 370 may receive the first driving voltage VDD1 through the first driving voltage supply line VDDL1 and receive the second driving voltage VDD2 through the second driving voltage supply line VDDL2.

The power supply unit 330 may be mounted on the circuit board 320, and the second switching unit 370 may be disposed in the non-display area NDA of the display panel 300. For example, the second switching unit 370 may be disposed at one edge or corner of the non-display area NDA, but the present invention is not limited thereto. For example, the second switching unit 370 may be provided between the general area MDA and the display driving circuit 310.

The first driving voltage generator 331 may generate a first driving voltage VDD1 and supply the first driving voltage VDD1 to the first driving voltage supply line VDDL1. The first driving voltage supply line VDDL1 may be connected to the display driving circuit 310 from the first driving voltage generator 331, and may be connected to the first switching element SW1 from the display driving circuit 310. The first switching element SW1 is connected to the first voltage supply line VL1, and the first driving voltage VDD1 is transferred to the first switching element SW1. Accordingly, the first sub-pixels SP1 may receive the first driving voltage VDD1 through the first voltage supply line VL1.

The first driving voltage generator 331 may be connected to the first switching element SW1 of the second switching unit 370 through the first driving voltage supply line VDDL1. The first driving voltage generator 331 may generate a first driving voltage VDD1 and supply the first driving voltage VDD1 to the first switching element SW1. The first switching element SW1 may selectively supply the first driving voltage VDD1 to the second voltage supply line VL2 based on a first mode signal MS1. For example, the first switching element SW1 may receive the first mode signal MS1 from the mode selector 350 to be turned on. The mode selector 350 may supply the first mode signal MS1 to the first switching element SW1 of the second switching unit 370 in the first mode or the power saving mode. Accordingly, the second sub-pixels SP2 may receive the first driving voltage VDD1 through the second voltage supply line VL2 in the first mode.

The second driving voltage generator 332 may be connected to the second switching element SW2 of the second switching unit 370 through the second driving voltage supply line VDDL2. The second driving voltage supply line VDDL2 may be connected to the display driving circuit 310 from the second driving voltage generator 332, and may be connected to the second switching unit 370 from the display driving circuit 310. The second driving voltage generator 332 may generate a second driving voltage VDD2 and supply the second driving voltage VDD2 to the second switching element SW2. The second switching element SW2 may selectively supply the second driving voltage VDD2 to the second voltage supply line VL2 based on a second mode signal MS2. For example, the second switching element SW2 may receive the second mode signal MS2 from the mode selector 350 to be turned on. The mode selector 350 may supply the second mode signal MS2 to the second switching element SW2 of the second switching unit 370 in the second mode or the general mode. Accordingly, the second sub-pixels SP2 may receive the second driving voltage VDD2 through the second voltage supply line VL2, which is connected to the second switching element SW2, in the second mode.

Accordingly, the second switching unit 370 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

Figure 13:
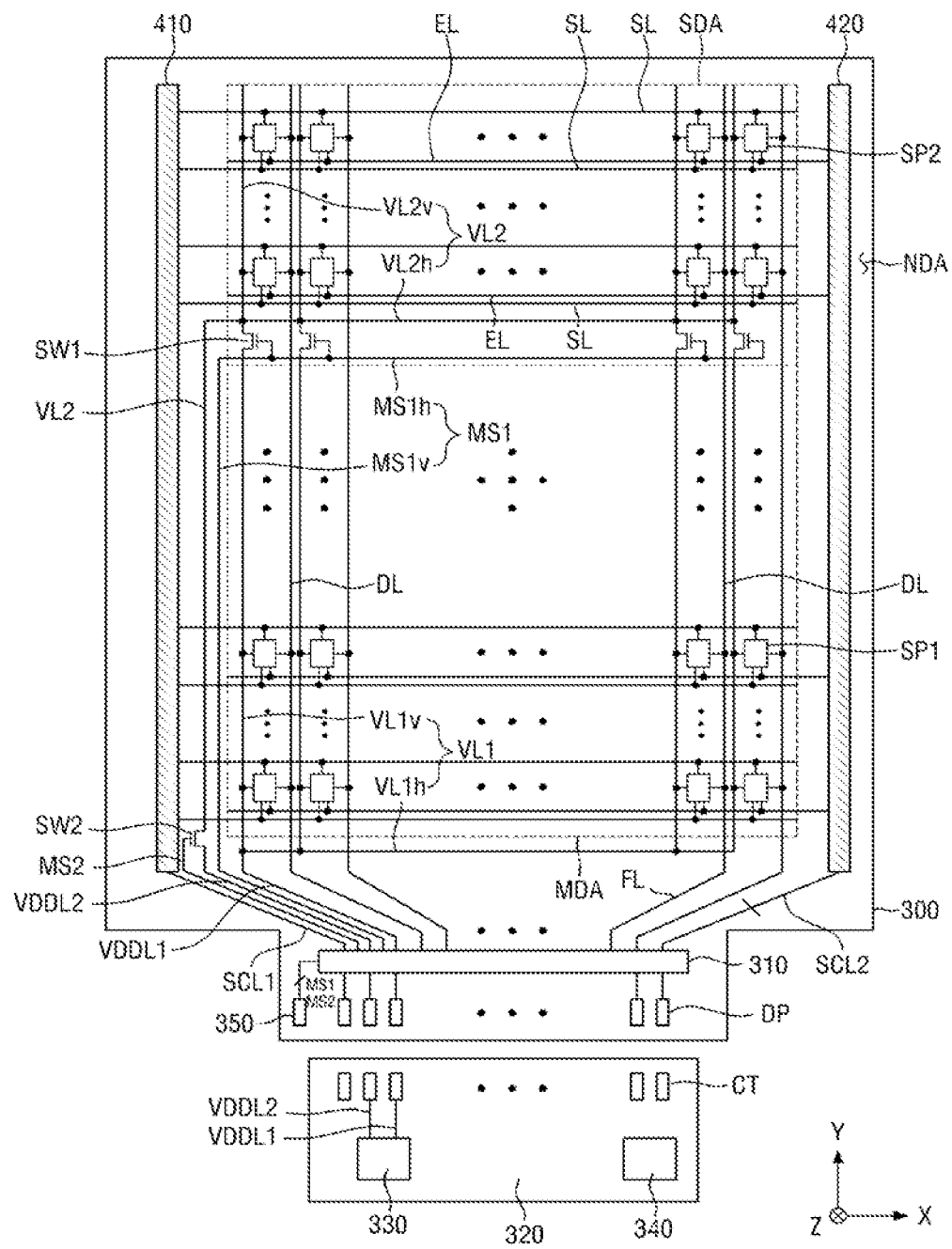
FIG. 13 is a detailed plan view of a display device according to an exemplary embodiment of the present invention.

FIG. 13 is a plan view of a display device according to an exemplary embodiment of the present invention. The display device of FIG. 13 is different from the aforementioned display device in that the configuration of supplying first and second driving voltages VDD1 and VDD2 is different. Therefore, configurations that are the same as the above-described configurations may be briefly described or omitted.

Referring to FIG. 13, the display panel 300 may include a general area MDA, a sensor area SDA, and a non-display area NDA.

The general area MDA includes first sub-pixels SP1, first voltage supply lines VL1, scan lines SL, and emission control lines EML, and data lines DL. In addition, the first voltage supply lines VL1 are connected to the first sub-pixels SP1.

The first sub-pixels SP1 may receive a first driving voltage VDD1 through first voltage supply lines VL1. Here, the first driving voltage VDD1 may be a high-potential voltage for driving the light emitting elements of the first sub-pixels SP1. The first voltage supply line VL1 may include a first horizontal voltage supply line VL1$h$ and a first vertical voltage supply line VL1$v$.

The sensor area SDA may include second sub-pixels SP2, second voltage supply lines VL2, scan lines SL, and emission control lines EML, and data lines DL. In addition, the second voltage supply lines VL2 are connected to the second sub-pixels SP2.

The second sub-pixels SP2 may receive a first driving voltage VDD1 or a second driving voltage VDD2 through second voltage supply lines VL2. Here, the first driving voltage VDD1 may be a high-potential voltage for driving the light emitting elements of the second sub-pixels SP2 in the first mode or the power saving mode, and the second driving voltage VDD2 may be a high-potential voltage for driving the light emitting elements of the second sub-pixels SP2 in the second mode or the general mode. The second driving voltage VDD2 may be greater than the first driving voltage VDD1. The display device 10 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform. The second voltage supply line VL2 may include a second horizontal voltage supply line VL2$h$ and a second vertical voltage supply line VL2$v$.

The magnitude of the second driving voltage VDD2 may be determined according to a ratio of the number of first sub-pixels SP1 per unit area to the number of second sub-pixels SP2 per unit area. For example, when the area of the pixel area of the sensor area SDA is substantially the same as the area of the transmission area of the sensor area SDA, the number of second sub pixels SP2 per unit area may correspond to about half of the number of first sub pixels SP1 per unit area. Thus, the luminance of the sensor area SDA may correspond to about half of the luminance of the general area MDA. Accordingly, the display device 10 may set the magnitude of the second driving voltage VDD2 to be about $2^{(1/2)}$ times or about 1.414 times of the first driving voltage VDD1, thereby making the luminance of the sensor area SDA and the luminance of the general area MDA substantially uniform. The display device 10 may prevent the reduction of the luminance of the sensor area by controlling the magnitude of the second driving voltage VDD2 based on the ratio of the number of the first sub-pixels SP1 to the number of the second sub-pixels SP2.

The display panel 300 may include a display driving circuit 310, a circuit board 320, a power supply unit 330, a touch driving circuit 340, a mode selector 350, a first switching element SW1, and a second switching element SW2.

The power supply unit 330 may include a first driving voltage generator 331 and a second driving voltage generator 332.

The first driving voltage generator 331 may generate a first driving voltage VDD1 and supply the first driving voltage VDD1 to the first driving voltage supply line VDDL1. The first driving voltage supply line VDDL1 may be connected to the display driving circuit 310 from the first driving voltage generator 331, and may be connected to the first sub pixels SP1 from the display driving circuit 310. For example, the first driving voltage supply line VDDL1 may be connected to a node which is connected to the first voltage supply line VL1. Accordingly, the first sub-pixels SP1 may receive the first driving voltage VDD1 through the first voltage supply line VL1.

The first switching element SW1 may be disposed between the first vertical voltage supply line VL1$v$ and the second vertical voltage supply line VL2$v$. The first vertical voltage supply line VL1$v$ may receive the first driving voltage VDD1 through the first driving voltage supply line VDDL1. The first switching element SW1 may selectively connect the first vertical voltage supply line VL1$v$ and the second vertical voltage supply line VL2$v$ to each other based on the first mode signal MS1. For example, the first switching element SW1 may receive the first mode signal MS1 from the mode selector 350 to be turned on. The mode selector 350 may supply the first mode signal MS1 to the first switching element SW1 in the first mode or the power saving mode. Accordingly, the second sub-pixels SP2 may receive the first driving voltage VDD1 through the second voltage supply line VL2 in the first mode.

The plurality of first switching elements SW1 may be disposed at one side of the sensor area SDA. For example, the plurality of first switching elements SW1 may be disposed between the sensor area SDA and the general area MDA. For example, the second horizontal voltage supply line VL2$h$ may be disposed at the lower side of the sensor area SDA or the upper side of the general area MDA, but the present invention is not limited thereto.

The second driving voltage generator 332 may be connected to the second switching element SW2 through the second driving voltage supply line VDDL2. The second driving voltage supply line VDDL2 may be connected to the display driving circuit 310 from the second driving voltage generator 332, and may be connected to the second switching element SW2 from the display driving circuit 310. The second driving voltage generator 332 may generate a second driving voltage VDD2 and supply the second driving voltage VDD2 to the second switching element SW2. The second switching element SW2 may selectively supply the second driving voltage VDD2 to the second voltage supply line VL2 based on a second mode signal MS2. For example, the second switching element SW2 may receive the second mode signal MS2 from the mode selector 350 to be turned on. The mode selector 350 may supply the second mode signal MS2 to the second switching element SW2 in the second mode or the general mode. Accordingly, the second sub-pixels SP2 may receive the second driving voltage VDD2 through the second voltage supply line VL2 in the second mode.

The second switching element SW2 may be disposed in the non-display area NDA of the display panel 300. For example, the second switching element SW2 may be disposed adjacent to a side of the general area MDA. For example, the second switching element SW2 may be disposed at one edge or corner of the non-display area NDA, but the present invention is not limited thereto.

The display panel 300 may include a first vertical mode signal line MS1$v$ and a first horizontal mode signal line MS1$h$ that supply the first mode signal MS1 to the first switching element SW1. The first vertical mode signal line MS1$v$ and the first horizontal mode signal line MS1$h$ may be disposed on different layers on the substrate of the display panel 300. The first horizontal mode signal line MS1$h$ may be disposed on a first layer on the substrate, and the first vertical mode signal line MS1$v$ may be disposed on a second layer disposed on the first layer. The first horizontal mode signal line MS1$h$ and the first vertical mode signal line MS1$v$ may be connected to each other through a contact hole. For example, the first horizontal mode signal line MS1$h$ may be disposed on the same layer as the gate electrode of the first switching element SW1, and the first vertical mode signal line MS1$v$ may be disposed on the same layer as the source electrode and drain electrode of the first switching element SW1, but the present invention is limited thereto.

Accordingly, the display panel 300 may supply the first driving voltage VDD1 to the second sub-pixels SP2 in the first mode to reduce the power consumption of the display device 10, and may supply the second driving voltage VDD2 to the second sub-pixels SP2 in the second mode to make the luminance of the general area MDA and the luminance of the sensor area SDA substantially uniform.

Figure 14:
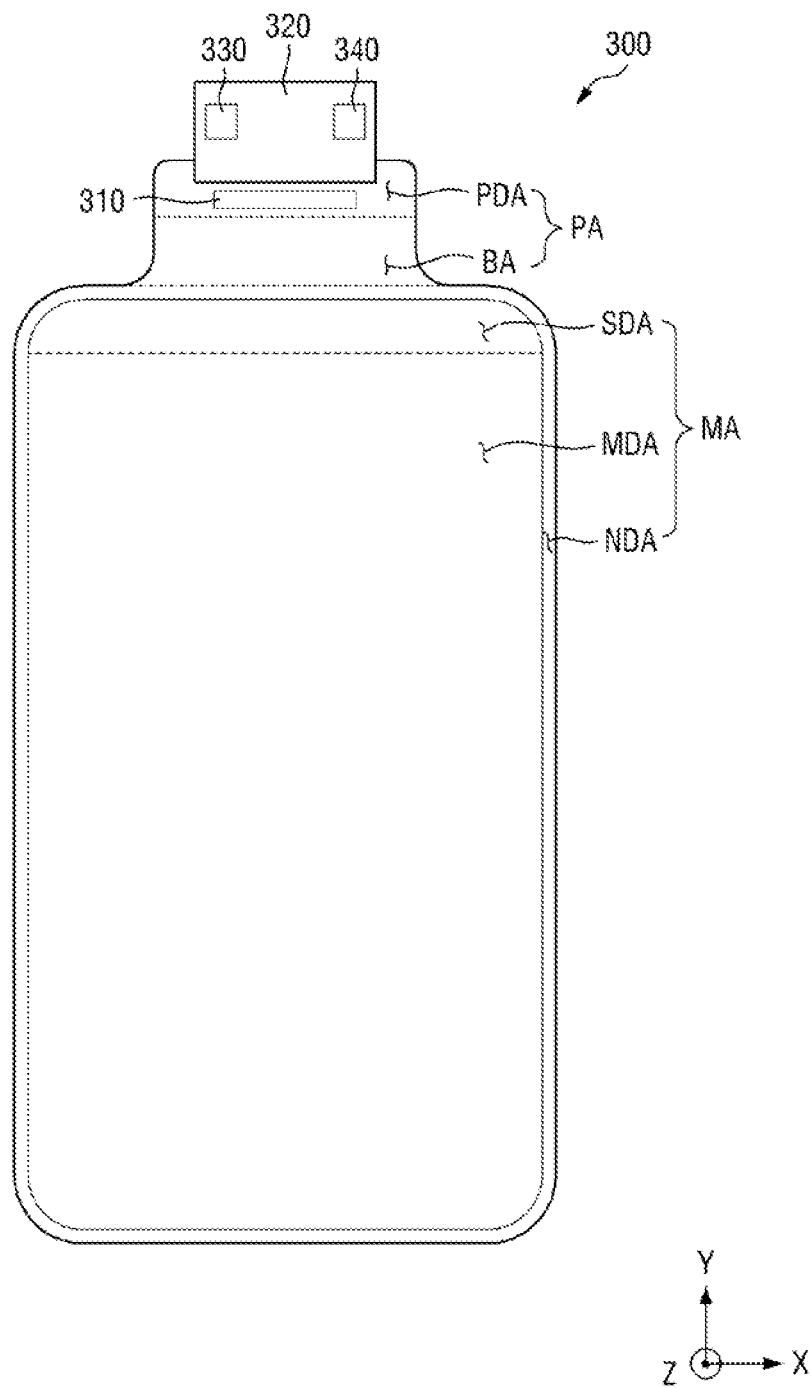
FIG. 14 is a plan view of a display device according to an exemplary embodiment of the present invention.
Figure 15:
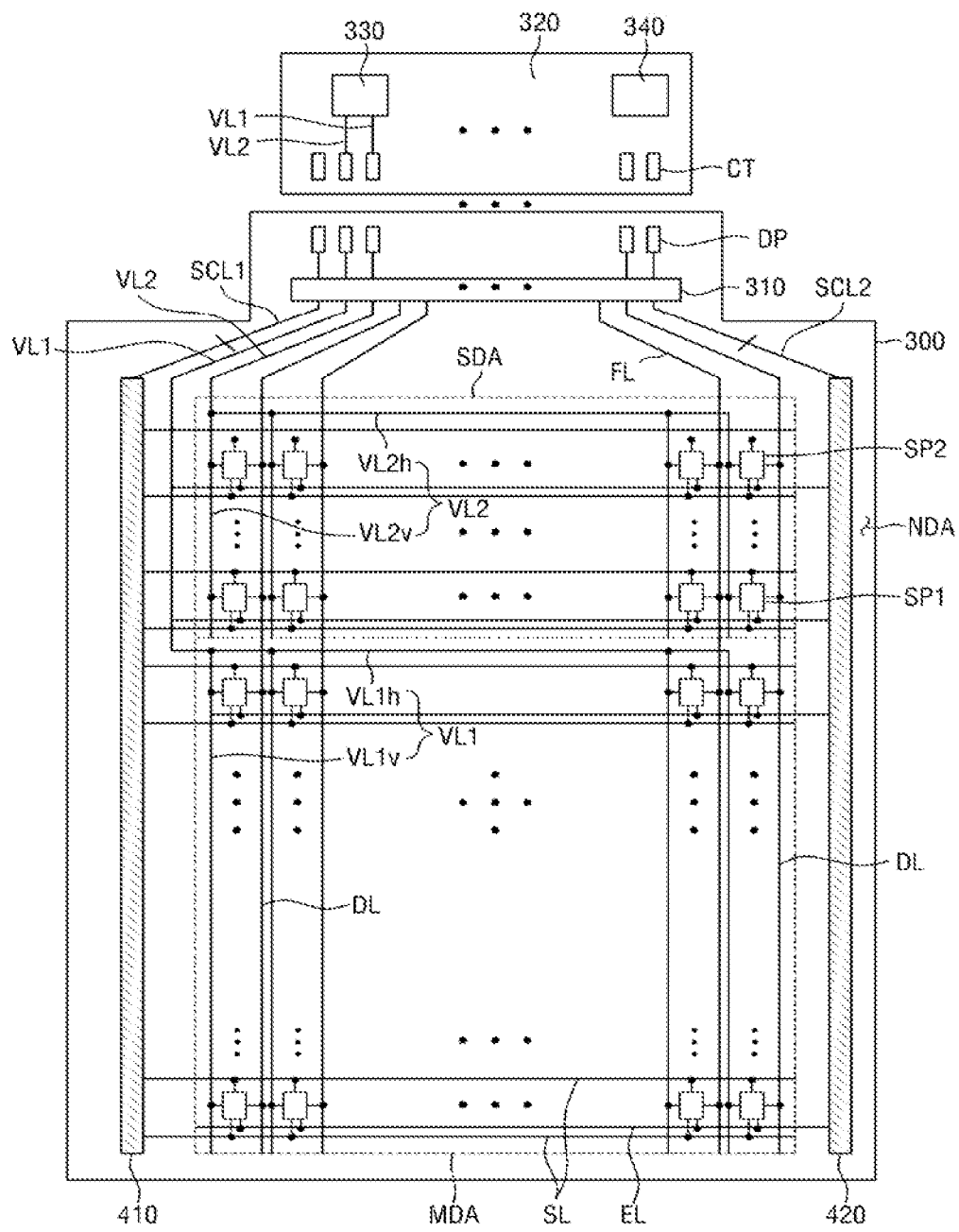
FIG. 15 is a detailed plan view of a display device according to an exemplary embodiment of the present invention.

FIG. 14 is a plan view of a display device according to an exemplary embodiment of the present invention, and FIG. 15 is a plan view of a display device according to an exemplary embodiment of the present invention. The display device of FIGS. 14 and 15 is different from the aforementioned display device in that the configuration of a protrusion area PA and the configuration of a circuit board 320 attached to a pad area PDA of the protrusion area PA are different. Therefore, configurations that are the same as the above-described configurations may be briefly described or omitted.

Referring to FIGS. 14 and 15, the display panel 300 may include a main area MA and a protrusion area PA protruding from one side of the main area MA.

The protrusion area PA may protrude from one side of the main area MA. As shown in FIG. 14, the protrusion area PA may protrude from the upper side of the sensor area SDA. For example, the length of the protrusion area PA in the first direction (X-axis direction) may be smaller than the length of the main area MA in the first direction (X-axis direction).

The protrusion area PA may include a bending area BA and a pad area PDA. In this case, the pad area PDA may be disposed at one side of the bending area BA, and the sensor area SDA may be disposed at the other side of the bending area BA. For example, the pad area PDA may be disposed at the upper side of the bending area BA, and the sensor area SDA may be disposed at the lower side of the bending area BA.

The display panel 300 may include a display driving circuit 310, a circuit board 320, a power supply unit 330, and a touch driving circuit 340.

The display driving circuit 310 may be disposed in the pad area PDA. The display driving circuit 310 may be disposed closer to the sensor area SDA than the general area MDA. The circuit board 320, which is mounted with the power supply unit 330 and the touch driving circuit 340, may be attached to the pad area PDA.

Therefore, the lengths of the second voltage supply lines VL2 connected to the second sub-pixels SP2 may be shorter than those of the aforementioned exemplary embodiments of the present invention (for example, exemplary embodiments of the present invention described with reference to FIGS. 4, 6, 8, 10, 12, and 13). The second driving voltage VDD2 supplied through the second voltage supply lines VL2 may be greater than the first driving voltage VDD1 supplied through the first voltage supply lines VL1. The display panel 300 may reduce the power consumption due to the self-resistance of the voltage supply lines by reducing the lengths of the second voltage supply lines VL2 through which a relatively high voltage flows.

Figure 16:
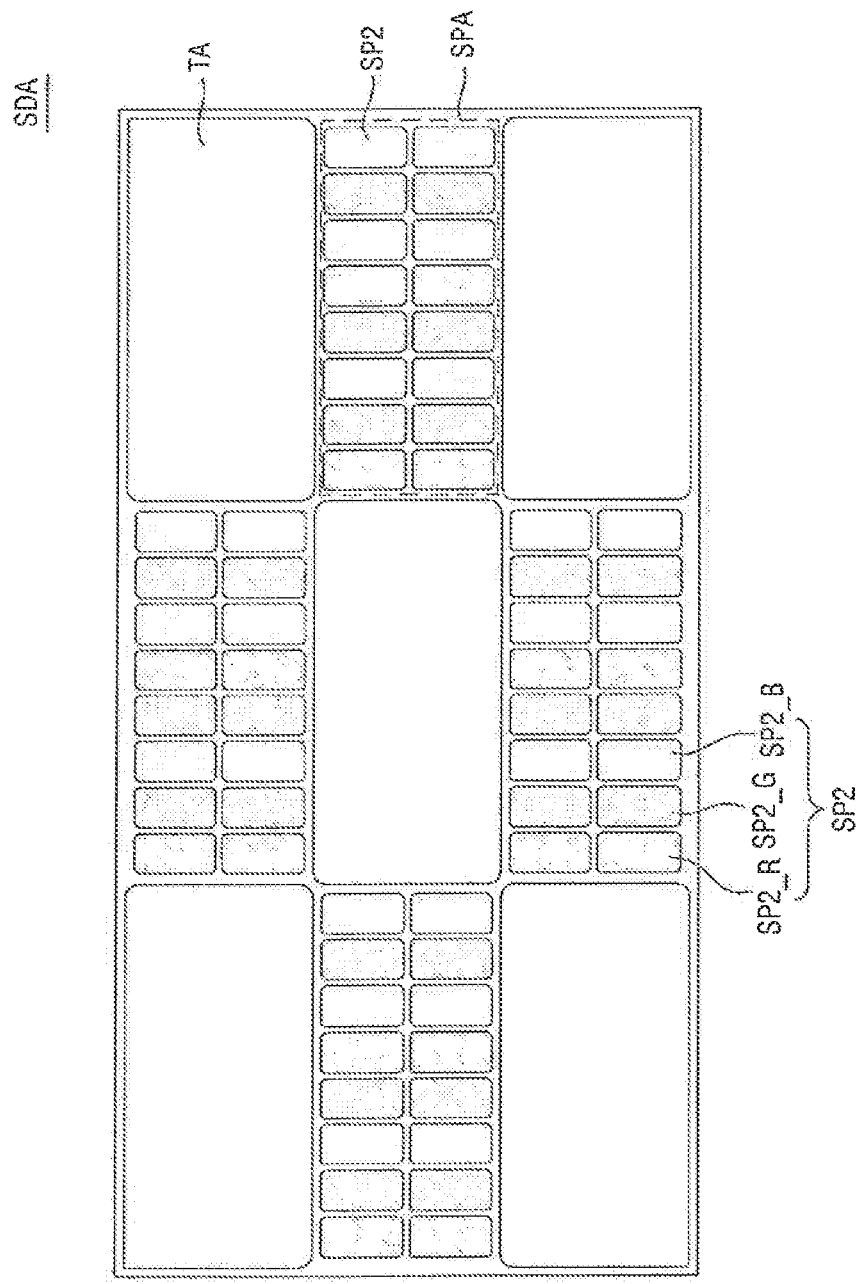
FIG. 16 is a plan view showing a pixel arrangement structure of a sensor area according to an exemplary embodiment of the present invention.

FIG. 16 is a plan view showing a pixel arrangement structure of a sensor area according to an exemplary embodiment of the present invention.

Referring to FIG. 16, the sensor area SDA may include pixel areas SPA, in each of which the second sub-pixels SP2 are disposed, and transmission areas TA that transmit light. The transmission area TA may be surrounded by the second sub-pixels SP2. Since the general area MDA does not include the transmission area, the number of second sub-pixels SP2 per unit area of the sensor area SDA may be smaller than the number of first sub-pixels SP1 per unit area of the general area MDA.

Each of the pixel areas SPA may include a red sub-pixel SP2_R, a green sub-pixel SP2_G, and a blue sub-pixel SP2_B. Each of the pixel areas SPA may determine the number of each of the red sub-pixels SP2_R, the green sub-pixels SP2_G, and the blue sub-pixels SP2_B based on the luminance difference of the red sub-pixel SP2_R, the green sub-pixel SP2_G, and the blue sub-pixel SP2_B. For example, each of the pixel areas SPA may include four red sub-pixels SP2_R, eight green sub-pixels SP2_G, and four blue sub-pixels SP2_B in an 8×2 array, but the present invention is not limited thereto.

The first sub pixels SP1 of the general area MDA may receive the first driving voltage VDD1, and the second sub pixels SP2 of the sensor area SDA may receive the second driving voltage VDD2. For example, the magnitude of the second driving voltage VDD2 may be greater than the magnitude of the first driving voltage VDD1.

The magnitude of the second driving voltage VDD2 may be determined according to a ratio of the number of first sub-pixels SP1 per unit area to the number of second sub-pixels SP2 per unit area. For example, when the area of the pixel area of the sensor area SDA is substantially the same as the area of the transmission area TA of the sensor area SDA, the number of second sub pixels SP2 per unit area may correspond to about half of the number of first sub pixels SP1 per unit area. Thus, the luminance of the sensor area SDA may correspond to about half of the luminance of the general area MDA. Accordingly, the display device 10 may set the magnitude of the second driving voltage VDD2 to be about $2^{(1/2)}$ times or about 1.414 times of the first driving voltage VDD1, thereby making the luminance of the sensor area SDA and the luminance of the general area MDA substantially uniform. The display device 10 may prevent the reduction of the luminance of the sensor area by controlling the magnitude of the second driving voltage VDD2 based on the ratio of the number of the first sub-pixels SP1 to the number of the second sub-pixels SP2.

Figure 17:
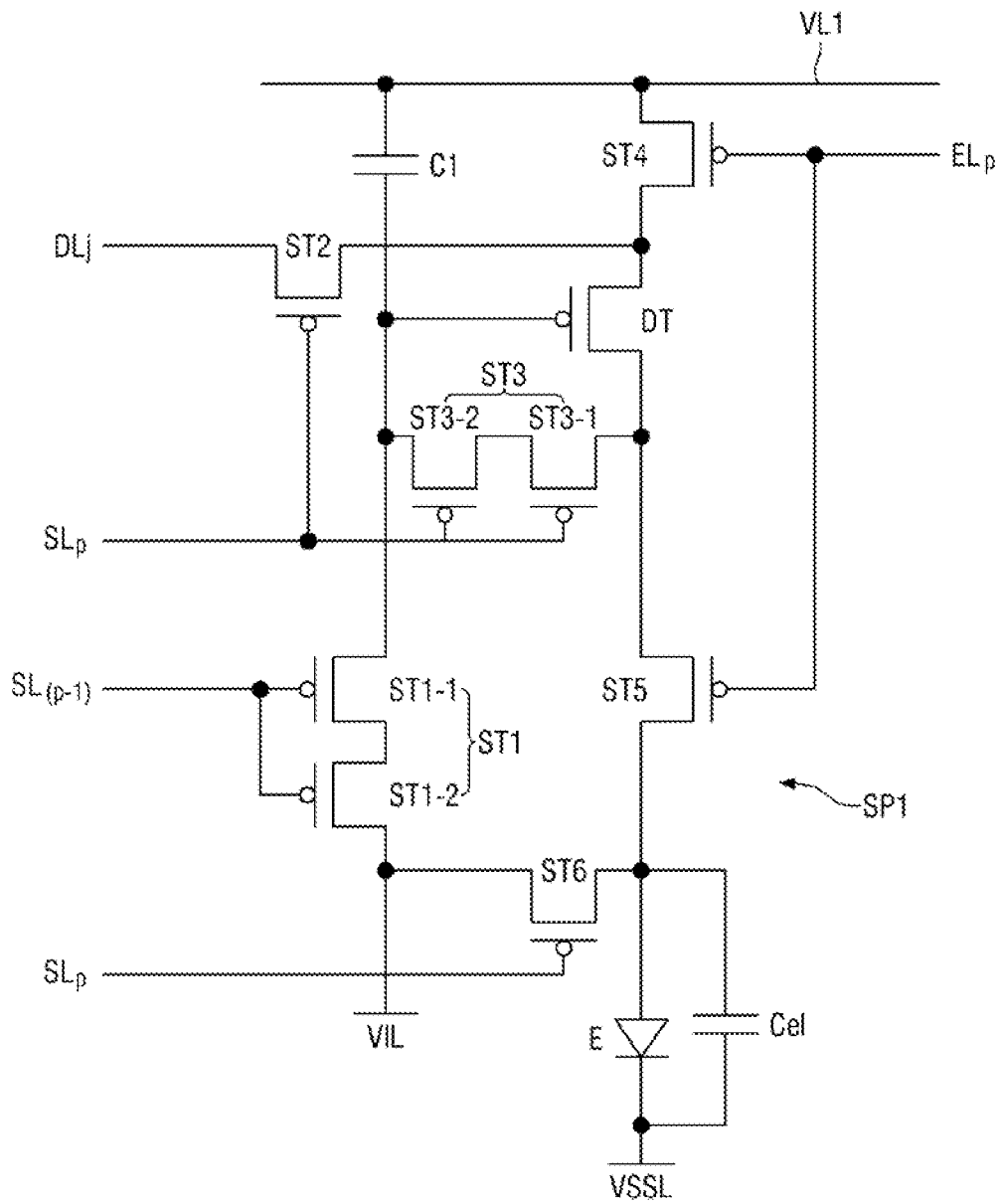
FIG. 17 is a circuit diagram showing first sub-pixels according to an exemplary embodiment of the present invention.
Figure 18:
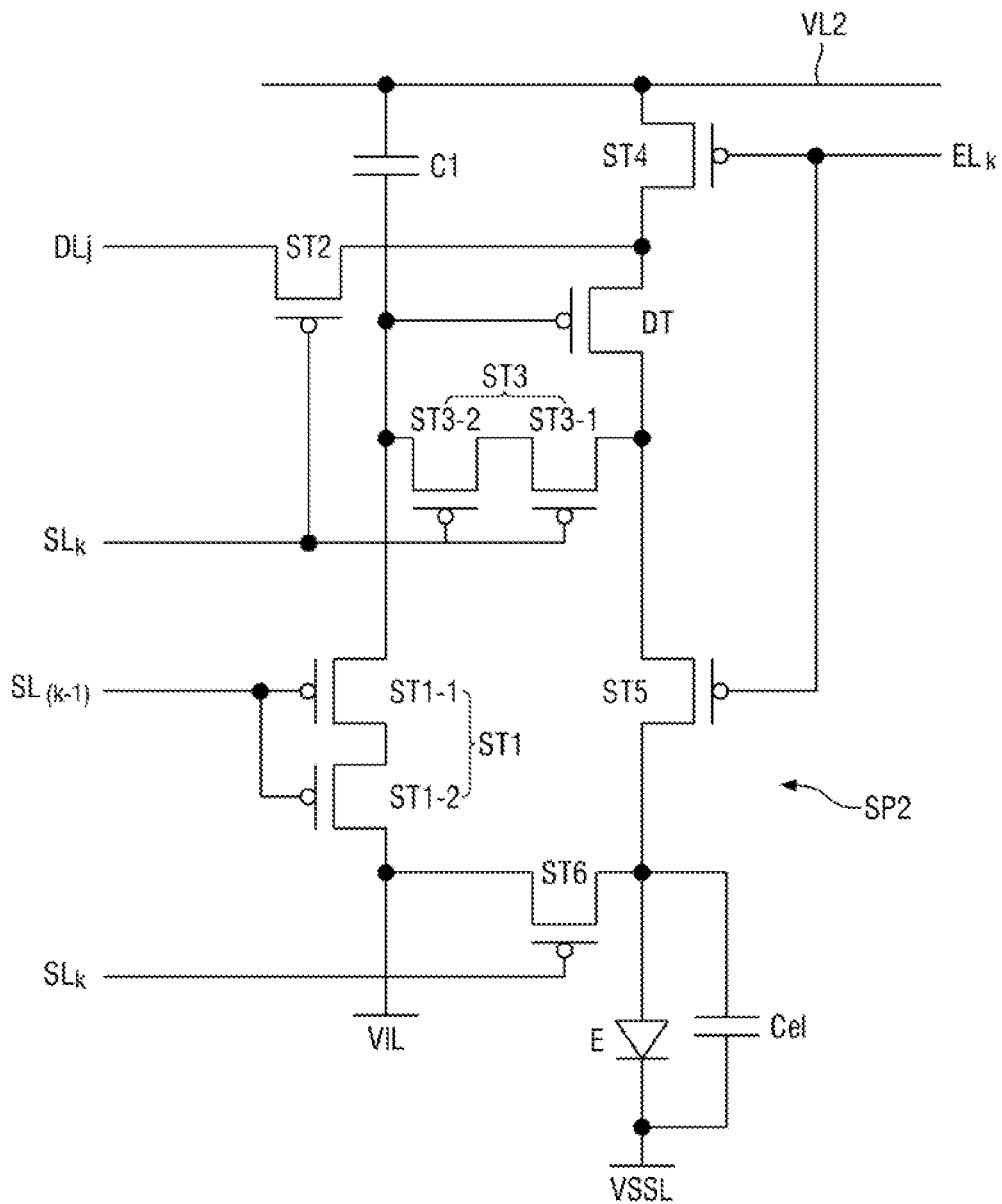
FIG. 18 is a circuit diagram showing second sub-pixels according to an exemplary embodiment of the present invention.

FIG. 17 is a circuit diagram showing first sub-pixels according to an exemplary embodiment of the present invention, and FIG. 18 is a circuit diagram showing second sub-pixels according to an exemplary embodiment of the present invention. The first sub-pixels SP1 may be disposed in the general area MDA and connected to the first driving voltage line VL1, and the second sub-pixels SP2 may be disposed in the sensor area SDA and connected to the second driving voltage line VL2. Except for these differences, the configuration (for example, the configuration of the driving transistor DT and the plurality of transistors) of the pixel circuit of the first sub-pixels SP1 may be substantially the same as the configuration of the pixel circuit of the second sub-pixels SP2. Hereinafter, the pixel circuit of the first sub-pixels SP1 will be mainly described, and a redundant description of the pixel circuit of the second sub-pixels SP2 may be omitted.

Referring to FIGS. 17 and 18, the first sub-pixel SP1 may overlap a p–1-th scan line SL (p–1), a p-th scan line SLp, and a j-th data line DLj. The first sub-pixel SP1 may be connected to a first voltage supply line VL1 to which a first driving voltage VDD1 is supplied, an initialization voltage line VIL to which an initialization voltage is supplied, and a third voltage supply line VSSL to which a third driving voltage is supplied.

The first sub-pixel SP1 may include a driving transistor DT, a light emitting element E, switching elements, and a first capacitor C1. The switching elements may include first to sixth transistors ST1, ST2, ST3, ST4, ST5, and ST6.

The driving transistor DT may include a gate electrode, a source electrode, and a drain electrode. The driving transistor DT may control a source-drain current Isd (hereinafter, referred to as a "driving current") according to a data voltage applied to the gate electrode of the driving transistor DT. The driving current Isd flowing through a channel of the driving transistor DT may be proportional to the square of a difference between the voltage Vsg between the source electrode and gate electrode of the driving transistor DT and the threshold voltage Vth (Isd=k'×(Vsg−Vth)$^2$). Here, k' refers to a proportionality coefficient determined by the structure and physical characteristics of the driving transistor DT. In addition, Vsg refers to a source-gate voltage of the driving transistor DT, and Vth refers to a threshold voltage of the driving transistor DT.

The light emitting element E may receive the driving current Isd to emit light. The emission amount or luminance of the light emitting element E may be proportional to the magnitude of the driving current Isd.

The light emitting element E may be an organic light emitting diode including an anode electrode, a cathode electrode, and an organic light emitting layer disposed between the anode electrode and the cathode electrode. In addition, the light emitting element E may be an inorganic light emitting element including an anode electrode, a cathode electrode, and an inorganic semiconductor disposed between the anode electrode and the cathode electrode. In addition, the light emitting element E may be a quantum dot light emitting element including an anode electrode, a cathode electrode, and a quantum dot light emitting layer disposed between the anode electrode and the cathode electrode. In addition, the light emitting element E may be a micro light emitting diode.

The anode electrode of the light emitting element E may be connected to the drain electrode of the fifth transistor ST5 and the drain electrode of the sixth transistor ST6, and the cathode electrode of the light emitting element E may be connected to the third voltage supply line VSSL. A parasitic capacitance Ce1 may be formed between the anode electrode and cathode electrode of the light emitting element E.

The first transistor ST1 may be formed as a dual transistor including a first-first transistor ST1-1 and a first-second transistor ST1-2. The first-first transistor ST1-1 and the first-second transistor ST1-2 may be turned on by the scan signal of the p–1-th scan line SL (p–1) to connect the gate electrode of the driving transistor DT to the initialization voltage line VIL. The gate electrode of the driving transistor DT may be discharged to the initialization voltage of the initialization voltage line VIL. The gate electrode of the first-first transistor ST1-1 may be connected to the p–1-th scan line SL (p–1), the source electrode thereof may be connected to the gate electrode of the driving transistor DT, and the drain electrode thereof may be connected to the source electrode of the first-second transistor ST1-2. The gate electrode of the first-second transistor ST1-2 may be connected to the p–1-th scan line SL (p–1), the source electrode thereof may be connected to the drain electrode of the first-first transistor ST1-1, and the drain electrode thereof may be connected to the initialization voltage line VIL.

The second transistor ST2 may be turned on by the scan signal of the p-th scan line SLp to connect the source electrode of the driving transistor DT to the j-th data line Dj. The gate electrode of the second transistor ST2 may be connected to the p-th scan line SLp, the source electrode thereof may be connected to the data line Dj, and the drain electrode thereof may be connected to the source electrode of the driving transistor DT.

The third transistor ST3 may be formed as a dual transistor including a third-first transistor ST3-1 and a third-second transistor ST3-2. The third-first transistor ST3-1 and the third-second transistor ST3-2 may be turned on by the scan signal of the p-th scan line SLp to connect the gate electrode and drain electrode of the driving transistor DT to each other. For example, when the third-first transistor ST3-1 and the third-second transistor ST3-2 are turned on, since the gate electrode and drain electrode of the driving transistor DT are connected to each other, the driving transistor DT may be driven as a diode. The gate electrode of the third-first transistor ST3-1 may be connected to the p-th scan line SLp, the source electrode of the third-first transistor ST3-1 may be connected to the drain electrode of the driving transistor DT, and the drain electrode of the third-first transistor ST3-1 may be connected to the source electrode of the third-second transistor ST3-2. The gate electrode of the third-second transistor ST3-2 may be connected to the p-th scan line SLp, the source electrode of the third-second transistor ST3-2 may be connected to the drain electrode of the third-first transistor ST3-1, and the drain electrode of the third-second transistor ST3-2 may be connected to the gate electrode of the driving transistor DT.

The fourth transistor ST4 may be turned on by the emission signal of the p-th emission line ELp to connect the source electrode of the driving transistor DT to the first voltage supply line VL1. The gate electrode of the fourth transistor ST4 may be connected to the p-th light emission line ELp, the source electrode of the fourth transistor ST4 may be connected to the first voltage supply line VL1, and the drain electrode of the fourth transistor ST4 may be connected to the source electrode of the driving transistor DT.

The fifth transistor ST5 may be connected between the drain electrode of the driving transistor DT and the anode electrode of the light emitting element E. The fifth transistor ST5 may be turned on by the emission signal of the p-th emission line ELp to connect the drain electrode of the driving transistor DT to the anode electrode of the light emitting element E. The gate electrode of the fifth transistor ST5 may be connected to the p-th emission line ELp, the source electrode of the fifth transistor ST5 may be connected to the drain electrode of the driving transistor DT, and the drain electrode of the fifth transistor ST5 may be connected to the anode electrode of the light emitting element E. When both the fourth transistor ST4 and the fifth transistor ST5 are turned on, the driving current Isd may be supplied to the light emitting element E.

The sixth transistor ST6 may be turned on by the scan signal of the p-th scan line SLp to connect the initialization voltage line VIL to the anode electrode of the light emitting element E. The sixth transistor ST6 may be turned on based on the scan signal from the p-th scan line SLp, and thus the anode electrode of the light emitting element E may be discharged to the initialization voltage. The gate electrode of the sixth transistor ST6 may be connected to the p-th scan line SLp, the source electrode of the sixth transistor ST6 may be connected to the initialization voltage line VIL, and the drain electrode of the sixth transistor ST6 may be connected to the anode electrode of the light emitting element E.

The first capacitor C1 may be formed between the source electrode of the driving transistor DT and the first voltage supply line VL1. One electrode of the first capacitor C1 may be connected to the source electrode of the driving transistor DT, and the other electrode thereof may be connected to the first voltage supply line VL2.

Although it is shown in FIGS. 17 and 18 that the first to sixth transistors ST1, ST2, ST3, ST4, ST5, and ST6 and the driving transistor DT are formed as P-type metal oxide semiconductor field effect transistors (P-type MOSFETs), the present invention is not limited thereto, and these transistors may be formed as N-type MOSFETs.

Each of the first to sixth transistors ST1, ST2, ST3, ST4, ST5, and ST6 and the driving transistor DT may be formed of an active layer including any one of, for example, polycrystalline silicon, amorphous silicon, or an oxide semiconductor. When the semiconductor layer of each of the first to sixth transistors ST1, ST2, ST3, ST4, ST5, and ST6 and the driving transistor DT includes polycrystalline silicon, these transistors may be formed through a low-temperature polycrystalline silicon (LTPS) process.

Figure 19:
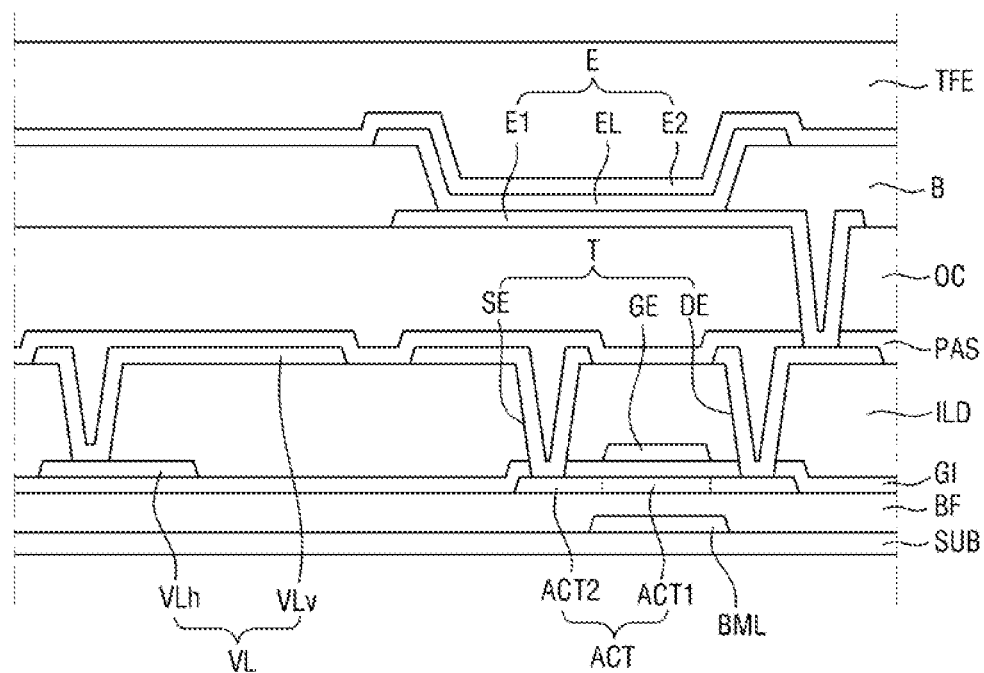
FIG. 19 is a cross-sectional view of a display device according to an exemplary embodiment of the present invention.

FIG. 19 is a cross-sectional view of a display device according to an exemplary embodiment of the present invention.

Referring to FIG. 19, the voltage supply line VL may include a horizontal voltage supply line VLh and a vertical voltage supply line VLv. For example, the horizontal voltage supply line VLh may be a first or second horizontal voltage supply line VL1h or VL2h, and the vertical voltage supply line VLv may be a first or second vertical voltage supply line VL1v or VL2v.

The horizontal voltage supply line VLh and the vertical voltage supply line VLv may be disposed on different layers on the substrate SUB of the display panel 300. The horizontal voltage supply line VLh may be disposed on a first layer disposed on the substrate SUB, and the vertical voltage supply line VLv may be disposed on a second layer disposed on the first layer. For example, the first layer may be a gate insulating film GI, and the second layer may be the interlayer insulating film ILD. The horizontal voltage supply line VLh and the vertical voltage supply line VLv may be connected to each other through a contact hole.

For example, the horizontal voltage supply line VLh may be disposed on the same layer as the gate electrode GE of the thin film transistor T disposed on the substrate SUB, and the vertical voltage supply line VLv may be disposed on the same layer as the source electrode SE and drain electrode DE of the thin film transistor T. However, the present invention is not limited thereto.

For example, the horizontal voltage supply line VLh may be disposed on the same layer as the gate electrode of the thin film transistor of the scan driver 410 or the emission control driver 420. The vertical voltage supply line VLv may be disposed on the same layer as the source electrode and drain electrode of the thin film transistor of the scan driver 410 or the emission control driver 420.

In a display device according to an exemplary embodiment of the present invention, since the sensor area of a display panel includes sensor devices, the number of pixels in the sensor area is smaller than the number of pixels in the general area of the display panel. Driving voltages different from each other are supplied to the pixels of the general area and the pixels of the sensor area, respectively. Therefore, the luminance of the general area and the luminance of the sensor area may be substantially uniform.

In a display device according to an exemplary embodiment of the present invention, a first driving voltage may be supplied to the pixels in the general area of the display panel, a first driving voltage may be supplied to the pixels in the sensor area of the display panel at the first mode, and a second driving voltage, which is higher than the first driving voltage, may be supplied to the pixels in the sensor area at the second mode, thereby reducing the power consumption of the display device.

While the present invention has been described with reference to exemplary embodiments thereof, it will be understood by those of ordinary skill in the art that various changes in form and details may be made thereto without departing from the spirit and scope of the present invention.

What is claimed is:

1. A display device, comprising:
   a display panel comprising a first area and a second area, wherein the first area includes first sub-pixels, and the second area includes second sub-pixels, the number per unit area of the first sub-pixels is greater than the number per unit area of the second sub-pixels;
   at least one sensor overlapping the second area;
   a power supply unit that generates a first driving voltage and a second driving voltage greater than the first driving voltage to supply the first and second driving voltages to the display panel,
   wherein the first sub-pixels receive the first driving voltage, and the second sub-pixels receive the second driving voltage,
   wherein a first switching element is connected to the second sub-pixels and the power supply unit, and a second switching element is connected to the second sub-pixels and the power supply unit, wherein when the first switching element is turned on, the first switching element is configured to provide the first driving voltage to the second sub-pixels, and when the second switching element is turned on, the second switching element is configured to provide the second driving voltage to the second sup-pixels.

2. The display device of claim 1, wherein the power supply unit comprises:
   a first driving voltage generator that generates the first driving voltage; and
   a second driving voltage generator that generates the second driving voltage.

3. The display device of claim 2, wherein the power supply unit further comprises:
   the first switching element selectively connecting the first driving voltage generator to the second sub-pixels; and
   the second switching element selectively connecting the second driving voltage generator to the second sub-pixels,
   wherein the second sub-pixels selectively receive one of the first driving voltage and the second driving voltage.

4. The display device of claim 3, further comprising a mode selector that supplies first and second mode signals to the power supply unit,
   wherein the first switching element receives the first mode signal from the mode selector to be turned on, and the second switching element receives the second mode signal from the mode selector to be turned on.

5. The display device of claim 2, further comprising a display driving circuit that drives the display panel,
   wherein the display driving circuit comprises:
   the first switching element selectively connecting the first driving voltage generator to the second sub-pixels; and
   the second switching element selectively connecting the second driving voltage generator to the second sub-pixels.

6. The display device of claim 5, further comprising a mode selector that supplies first and second mode signals to the display driving circuit,
   wherein the first switching element receives the first mode signal from the mode selector to be turned on, and the second switching element receives the second mode signal from the mode selector to be turned on.

7. The display device of claim 2, further comprising a first switching unit mounted on a circuit board, wherein the power supply unit is mounted on the circuit board,
   wherein the first switching unit comprises:
   the first switching element selectively connecting the first driving voltage generator to the second sub-pixels; and
   the second switching element selectively connecting the second driving voltage generator to the second sub-pixels.

8. The display device of claim 7, further comprising a mode selector that supplies first and second mode signals to the first switching unit,
   wherein the first switching element receives the first mode signal from the mode selector to be turned on, and the second switching element receives the second mode signal from the mode selector to be turned on.

9. The display device of claim 2, further comprising a second switching unit disposed on a substrate of the display panel,
   wherein the second switching unit comprises:
   the first switching element selectively connecting the first driving voltage generator to the second sub-pixels; and
   the second switching element selectively connecting the second driving voltage generator to the second sub-pixels.

10. The display device of claim 9, further comprising a mode selector supplying first and second mode signals to the second switching unit,
    wherein the first switching element receives the first mode signal from the mode selector to be turned on, and the second switching element receives the second mode signal from the mode selector to be turned on.

11. The display device of claim 1, wherein the display panel comprises:
    a first horizontal voltage supply line disposed at one side of the first area;
    a first vertical voltage supply line connected to the first horizontal voltage supply line, wherein the first vertical voltage supply line supplies the first driving voltage to the first sub-pixels;
    a second horizontal voltage supply line disposed at one side of the second area; and
    a second vertical voltage supply line connected to the second horizontal voltage supply line, wherein the second vertical voltage supply line supplies the first driving voltage or the second driving voltage to the second sub-pixels.

12. The display device of claim 11, wherein the display panel further comprises:
    the first switching element disposed between the first vertical voltage supply line and the second vertical voltage supply line; and
    the second switching element selectively supplying the second driving voltage to the second horizontal voltage supply line.

13. The display device of claim 12, further comprising a mode selector that supplies first and second mode signals to the first and second switching elements,
    wherein the first switching element receives the first mode signal from the mode selector to be turned on, and the second switching element receives the second mode signal from the mode selector to be turned on.

14. A display device, comprising:
    a display panel comprising a first area and a second area, wherein the first area includes first sub-pixels, and the second area includes second sub-pixels, the number per unit area of the first sub-pixels is greater than the number per unit area of the second sub-pixels;
    at least one sensor overlapping the second area; and
    wherein the display panel comprises:
    a first horizontal voltage supply line disposed at one side of the first area;
    a first vertical voltage supply line connected to the first horizontal voltage supply line, wherein the first vertical voltage supply line supplies a first driving voltage to the first sub-pixels, wherein the first vertical voltage supply line is disposed in the first area;
    a second horizontal voltage supply line disposed at one side of the second area; and
    a second vertical voltage supply line connected to the second horizontal voltage supply line, wherein the second vertical voltage supply line supplies the first driving voltage or a second driving voltage greater than the first driving voltage to the second sub-pixels, wherein the second vertical voltage supply line is disposed in the second area,
    wherein the first horizontal voltage supply line is disposed on a first layer disposed on a substrate of the display panel, and the first vertical voltage supply line is disposed on a second layer disposed on the first layer.

15. The display device of claim 14, wherein the second horizontal voltage supply line is disposed on the first layer disposed on the substrate of the display panel, and the second vertical voltage supply line is disposed on the second layer disposed on the first layer.

16. The display device of claim 14, wherein each of the first sub-pixels and the second sub-pixels further comprises a thin film transistor including an active layer, a gate electrode, a source electrode, and a drain electrode, and
wherein the first horizontal voltage supply line and the second horizontal voltage supply line are disposed on the same layer as the gate electrode, and the first vertical voltage supply line and the second vertical voltage supply line are disposed on the same layer as the source electrode and the drain electrode.

17. The display device of claim 14, further comprising a power supply unit including a first driving voltage generator that generates the first driving voltage and a second driving voltage generator that generates the second driving voltage.

18. The display device of claim 17, wherein the power supply unit further comprises:
a first switching element selectively connecting the first driving voltage generator to the second sub-pixels; and
a second switching element selectively connecting the second driving voltage generator to the second sub-pixels.

19. The display device of claim 17, further comprising a display driving circuit that drives the display panel,
wherein the display driving circuit further comprises:
a first switching element selectively connecting the first driving voltage generator to the second sub-pixels; and
a second switching element selectively connecting the second driving voltage generator to the second sub-pixels.

20. The display device of claim 17, further comprising a first switching unit mounted on a circuit board, wherein the power supply unit is mounted on the circuit board,
wherein the first switching unit comprises:
a first switching element selectively connecting the first driving voltage generator to the second sub-pixels; and
a second switching element selectively connecting the second driving voltage generator to the second sub-pixels.

21. The display device of claim 17, further comprising a second switching unit disposed on the substrate of the display panel,
wherein the second switching unit comprises:
a first switching element selectively connecting the first driving voltage generator to the second sub-pixels; and
a second switching element selectively connecting the second driving voltage generator to the second sub-pixels.

22. The display device of claim 17, wherein the display panel further comprises:
a first switching element disposed between the first vertical voltage supply line and the second vertical voltage supply line; and
a second switching element selectively connecting the second driving voltage generator to the second horizontal voltage supply line.

* * * * *